(12) United States Patent
Eldridge et al.

(10) Patent No.: US 6,939,474 B2
(45) Date of Patent: Sep. 6, 2005

(54) METHOD FOR FORMING MICROELECTRONIC SPRING STRUCTURES ON A SUBSTRATE

(75) Inventors: Benjamin N. Eldridge, Danville, CA (US); Stuart W. Wenzel, Pleasanton, CA (US)

(73) Assignee: FormFactor, Inc., Livermore, CA (US)

( * ) Notice: Subject to any disclaimer, the term of this patent is extended or adjusted under 35 U.S.C. 154(b) by 267 days.

(21) Appl. No.: 09/781,833

(22) Filed: Feb. 12, 2001

(65) Prior Publication Data

US 2001/0044225 A1 Nov. 22, 2001

Related U.S. Application Data

(63) Continuation-in-part of application No. 09/710,539, filed on Nov. 9, 2000, which is a continuation-in-part of application No. 09/364,788, filed on Jul. 30, 1999.

(51) Int. Cl.[7] .............................................. B29C 43/02
(52) U.S. Cl. ............................. 216/11; 216/13; 216/18; 216/38; 216/52; 216/53
(58) Field of Search ............................... 216/11, 13, 18, 216/27, 38, 52, 53; 205/122; 427/98; 264/496

(56) References Cited

U.S. PATENT DOCUMENTS

| | | | |
|---|---|---|---|
| 3,173,737 A | 3/1965 | Kinkaid et al. | |
| 3,519,890 A | 7/1970 | Ashby | |

(Continued)

FOREIGN PATENT DOCUMENTS

| | | |
|---|---|---|
| EP | 632281 | 1/1995 |
| EP | 899538 | 3/1999 |
| JP | 58-191453 | 11/1983 |
| JP | 05-18741 | 1/1993 |

(Continued)

OTHER PUBLICATIONS

"A New Wafer Probe Interface Technology Using Compliant Microsprings, A Joint Study by Teradyne, Inc. and Form-Factor, Inc.," Teradyne Formfactor White Paper (Teradyne, Inc. and FormFactor, Inc., Jan. 30, 1998), pp. 1–18.

(Continued)

*Primary Examiner*—Anita Alanko
(74) *Attorney, Agent, or Firm*—O'Melveny & Myers LLP; N. Kenneth Burraston

(57) ABSTRACT

A method for fabricating microelectronic spring structures is disclosed. In an initial step of the method, a layer of sacrificial material is formed over a substrate. Then, a contoured surface is developed in the sacrificial material, such as by molding the sacrificial material using a mold or stamp. The contoured surface provides a mold for at least one spring form, and preferably for an array of spring forms. If necessary, the sacrificial layer is then cured or hardened. A layer of spring material is deposited over the contoured surface of the sacrificial material, in a pattern to define at least one spring form, and preferably an array of spring forms. The sacrificial material is then at least partially removed from beneath the spring form to reveal at least one free-standing spring structure. A separate conducting tip is optionally attached to each resulting spring structure, and each structure is optionally plated or covered with an additional layer or layers of material, as desired. An alternative method for making a resilient contact structure using the properties of a fluid meniscus is additionally disclosed. In an initial step of the alternative method, a layer of material is provided over a substrate. Then, a recess is developed in the material, and fluid is provided in the recess to form a meniscus. The fluid is cured or hardened to stabilize the contoured shape of the meniscus. The stabilized meniscus is then used to define a spring form in the same manner as the molded surface in the sacrificial material.

19 Claims, 17 Drawing Sheets

U.S. PATENT DOCUMENTS

| | | | |
|---|---|---|---|
| 3,842,189 A | | 10/1974 | Southgate |
| 4,553,192 A | | 11/1985 | Babuka et al. |
| 4,615,573 A | | 10/1986 | White et al. |
| 4,772,228 A | | 9/1988 | Seymour |
| 4,893,172 A | | 1/1990 | Matsumoto et al. |
| H842 H | | 11/1990 | Ochs |
| 5,152,695 A | | 10/1992 | Grabbe et al. |
| 5,173,055 A | | 12/1992 | Grabbe |
| 5,210,939 A | | 5/1993 | Mallik et al. |
| 5,228,861 A | | 7/1993 | Grabbe |
| 5,286,208 A | | 2/1994 | Matsuoka |
| 5,462,440 A | | 10/1995 | Rothenberger |
| 5,513,430 A | | 5/1996 | Yanof et al. |
| 5,534,784 A | | 7/1996 | Lum et al. |
| 5,555,422 A | | 9/1996 | Nakano |
| 5,576,630 A | | 11/1996 | Fujita |
| 5,599,194 A | | 2/1997 | Ozawa et al. |
| 5,613,861 A | | 3/1997 | Smith et al. |
| 5,632,631 A | | 5/1997 | Fjelstad et al. |
| 5,666,190 A | | 9/1997 | Quate et al. |
| 5,688,699 A | * | 11/1997 | Cunningham et al. ......... 438/54 |
| 5,701,085 A | | 12/1997 | Malladi et al. |
| 5,772,905 A | * | 6/1998 | Chou .......................... 216/44 |
| 5,810,609 A | | 9/1998 | Faraci et al. |
| 5,821,763 A | | 10/1998 | Beaman et al. |
| 5,829,128 A | | 11/1998 | Eldridge et al. |
| 5,914,614 A | | 6/1999 | Beaman et al. |
| 5,944,537 A | * | 8/1999 | Smith et al. ................... 439/81 |
| 5,974,662 A | | 11/1999 | Eldridge et al. |
| 5,994,152 A | | 11/1999 | Khandros et al. |
| 6,014,032 A | | 1/2000 | Maddix et al. |
| 6,016,061 A | | 1/2000 | Mizuta |
| 6,029,344 A | | 2/2000 | Khandros et al. |
| 6,031,282 A | | 2/2000 | Jones et al. |
| 6,059,982 A | | 5/2000 | Palagonia et al. |
| 6,064,213 A | | 5/2000 | Khandros et al. |
| 6,072,190 A | | 6/2000 | Watanabe et al. |
| 6,117,344 A | * | 9/2000 | Cox et al. ...................... 216/11 |
| 6,136,243 A | * | 10/2000 | Mehregany et al. ......... 264/162 |
| 6,183,267 B1 | | 2/2001 | Marcus et al. |
| 6,184,053 B1 | | 2/2001 | Eldridge |
| 6,184,576 B1 | | 2/2001 | Jones et al. |
| 6,214,631 B1 | | 4/2001 | Burrows et al. |
| 6,255,126 B1 | | 7/2001 | Mathieu et al. |
| 6,255,727 B1 | | 7/2001 | Khoury |
| 6,289,583 B1 | | 9/2001 | Belmont et al. |
| 6,307,392 B1 | | 10/2001 | Soejima et al. |
| 6,344,752 B1 | | 2/2002 | Hagihara et al. |
| 6,359,455 B1 | | 3/2002 | Takekoshi |
| 6,406,636 B1 | * | 6/2002 | Vaganov ........................ 216/2 |
| 6,452,407 B2 | | 9/2002 | Khoury et al. |
| 6,713,374 B2 | | 3/2004 | Eldridge et al. |
| 2001/0040145 A1 | * | 11/2001 | Willson et al. ................ 216/52 |
| 2002/0055282 A1 | | 5/2002 | Eldridge et al. |
| 2003/0099737 A1 | | 5/2003 | Eldridge et al. |

FOREIGN PATENT DOCUMENTS

| | | | | |
|---|---|---|---|---|
| JP | 05-198716 | 8/1993 | | |
| JP | 06-267408 | 9/1994 | | |
| JP | 07-21968 | 1/1995 | | |
| JP | 07-333232 | 12/1995 | | |
| JP | 08-306708 | 11/1996 | | |
| TW | 341747 | 10/1998 | | |
| WO | WO 91/12706 | 8/1991 | | |
| WO | WO 96/16440 | 5/1996 | | |
| WO | WO 97/44676 | 11/1997 | | |
| WO | WO 98/21597 | 5/1998 | | |
| WO | WO 98/52224 | * 11/1998 | ........... H01L/23/48 |
| WO | WO 99/38229 | 7/1999 | | |
| WO | WO 00/33089 | 6/2000 | | |
| WO | WO 00/33096 | 6/2000 | | |
| WO | WO 01/9952 | 2/2001 | | |

OTHER PUBLICATIONS

Novitsky et al., "FormFactor Introduces An Integrated Process For Wafer–Level Packaging, Burn–in Testing, And Module Level Assembly" (FormFactor, Inc., Mar. 1999), 6 pages.

Khandros et al., "New Methods For Reducing Costs In Semiconductor Back–End," (FormFactor, Inc., Jan. 30, 1998), 9 pages.

U.S. Appl. No. 09/364,788, filed Jul. 30, 1999, Eldridge et al.

U.S. Appl. No. 09/364,855, filed Jul. 30, 1999, Eldridge et al.

U.S. Appl. No. 09/710,539, filed Nov. 9, 2000, Eldridge et al.

* cited by examiner

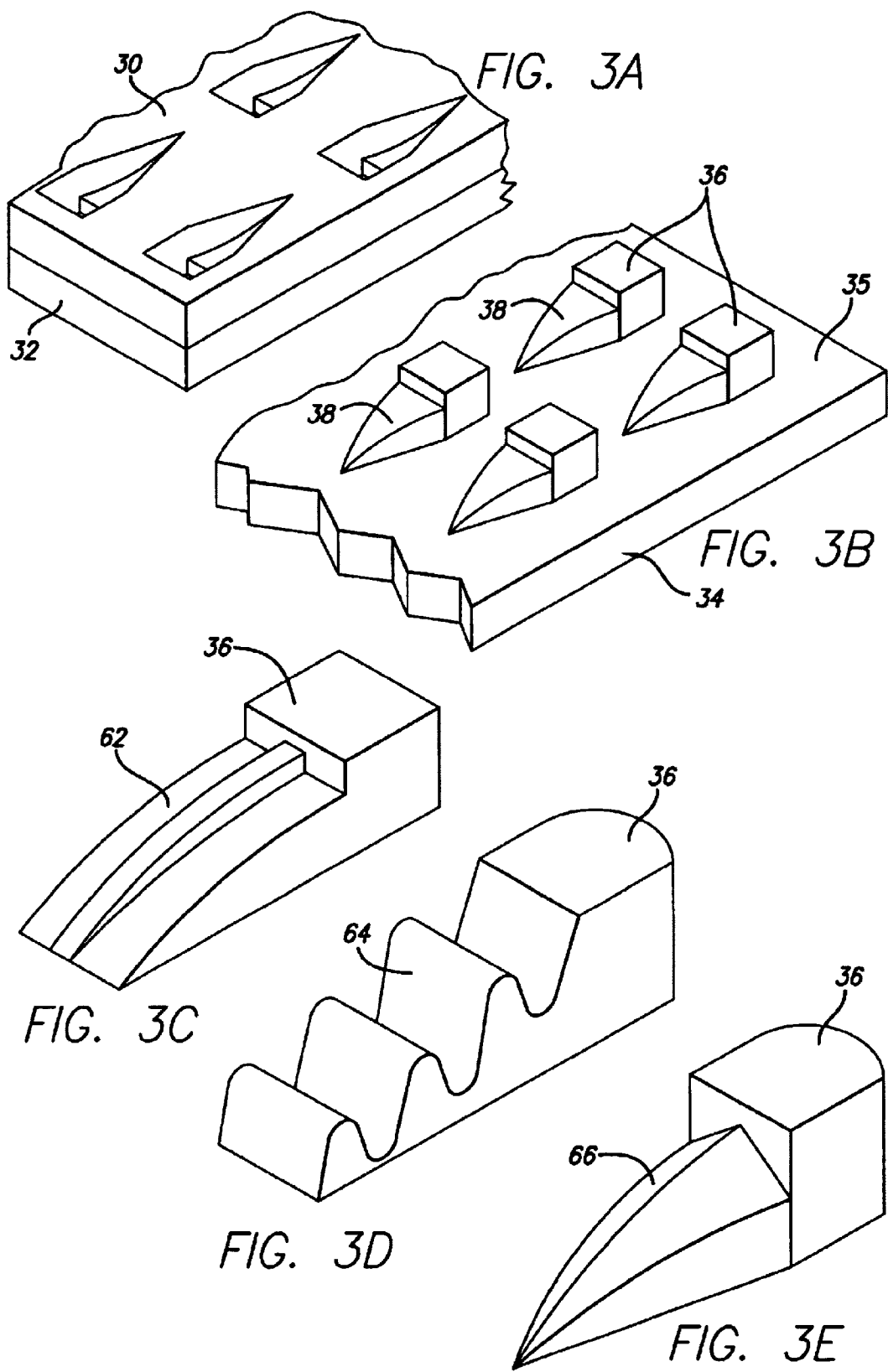

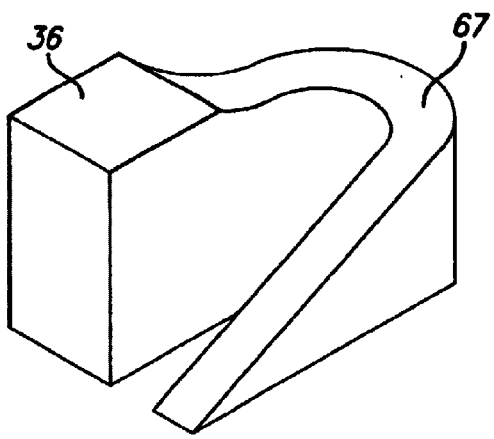
FIG. 3F
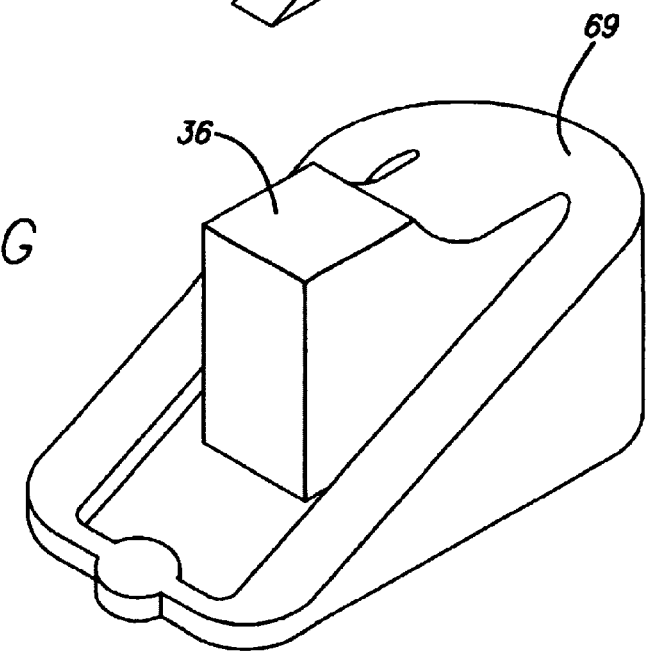
FIG. 3G
FIG. 4
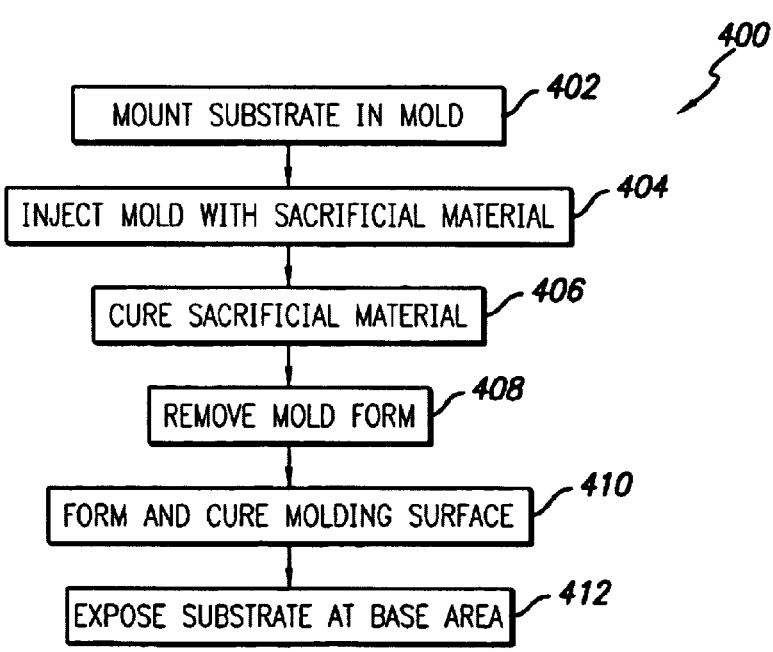

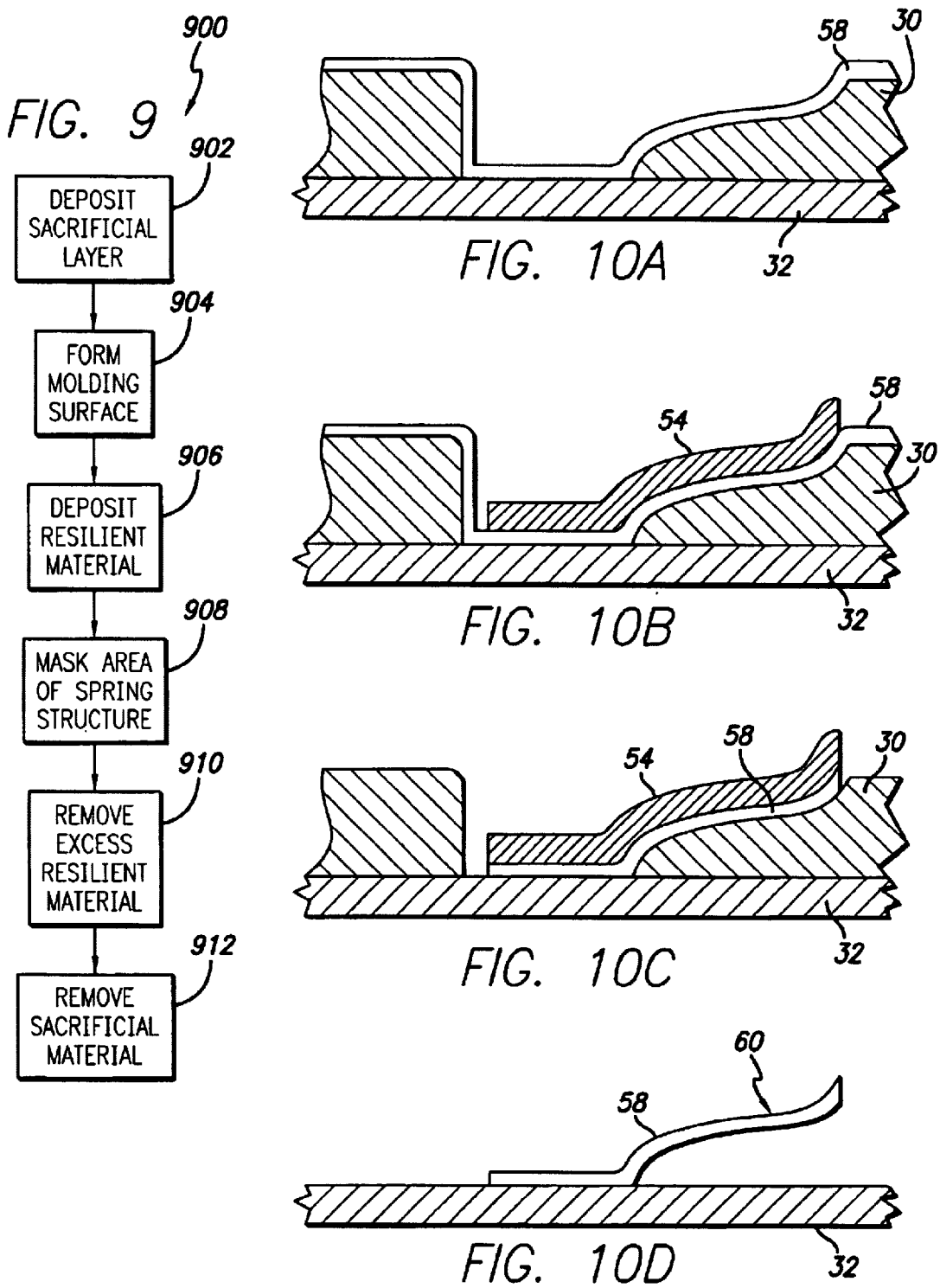

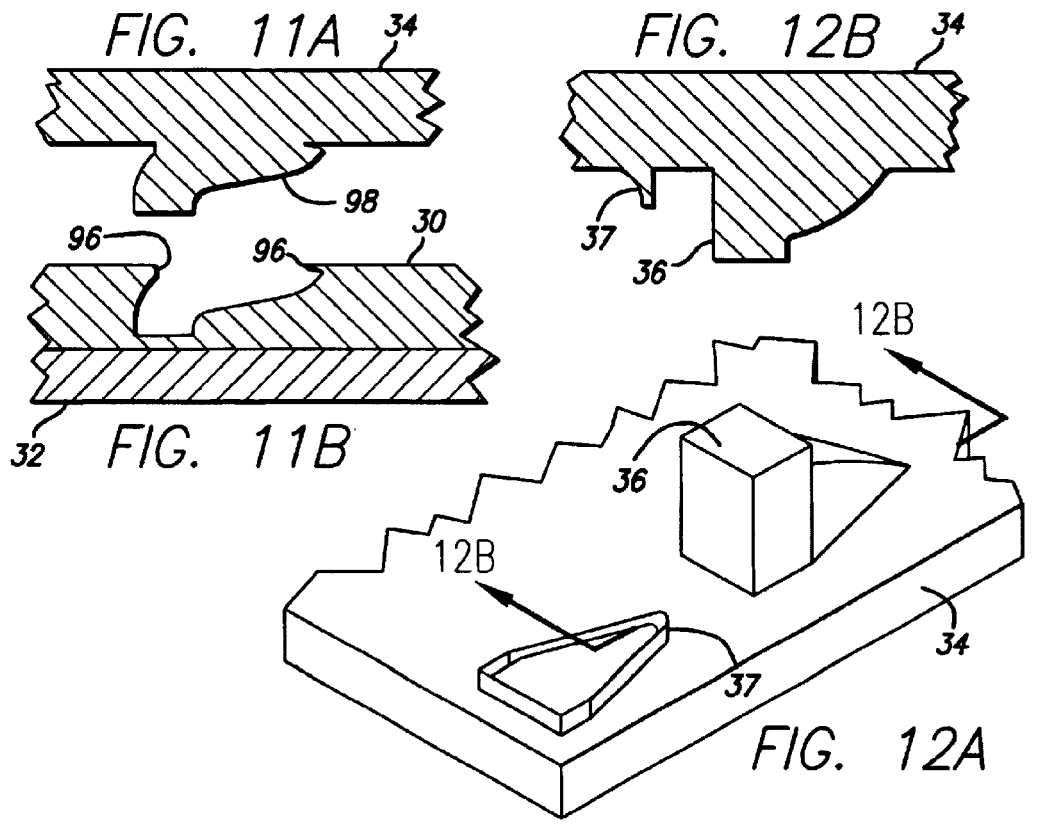
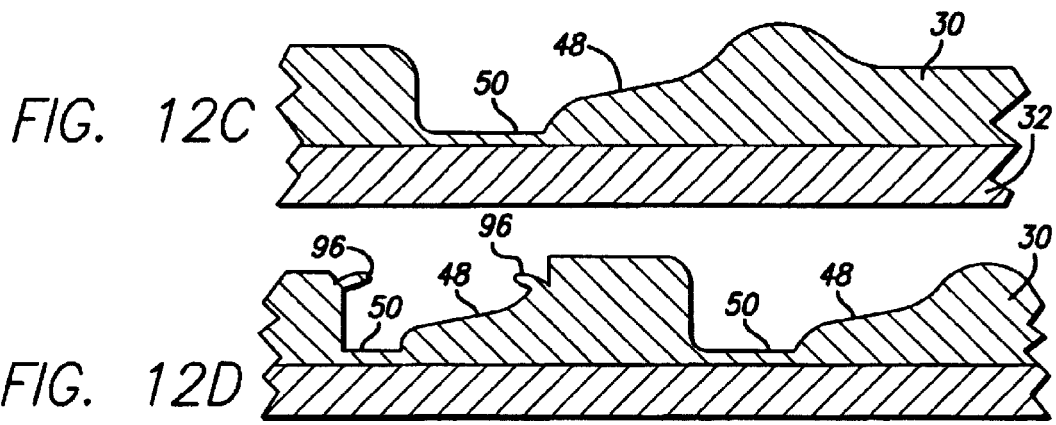
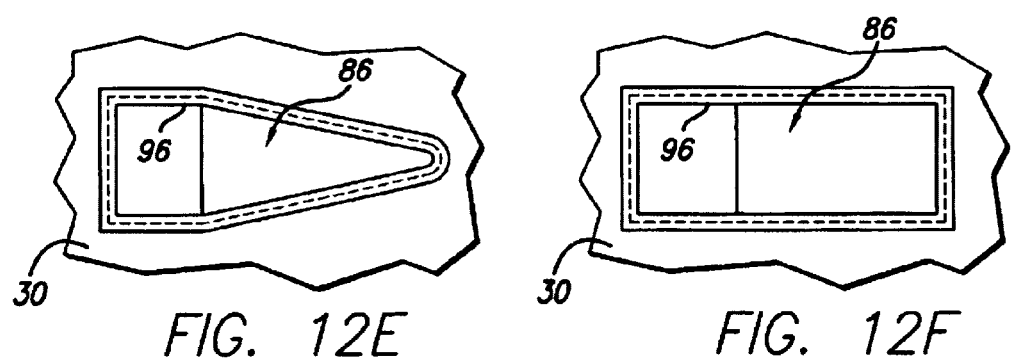

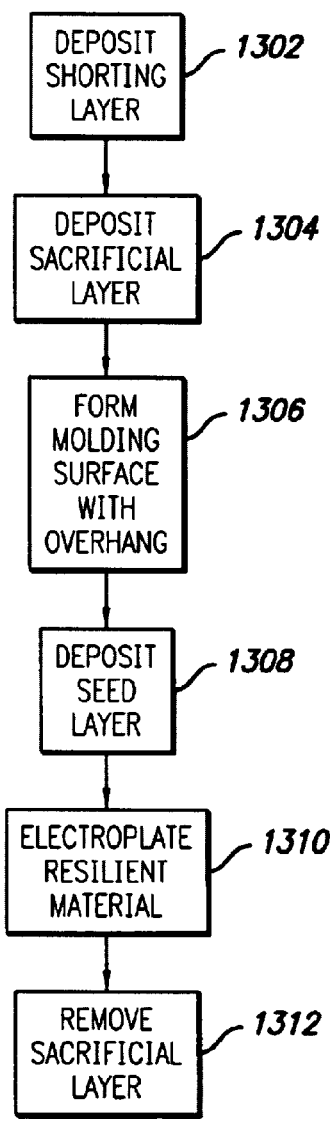
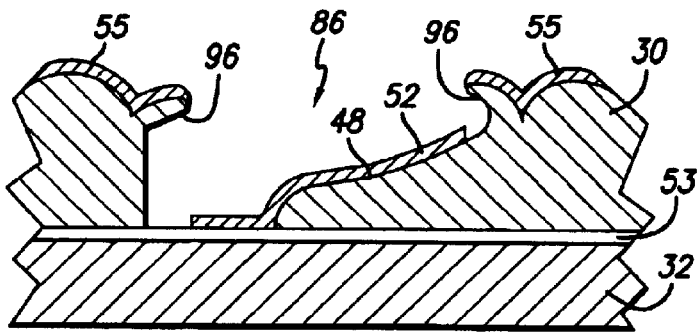
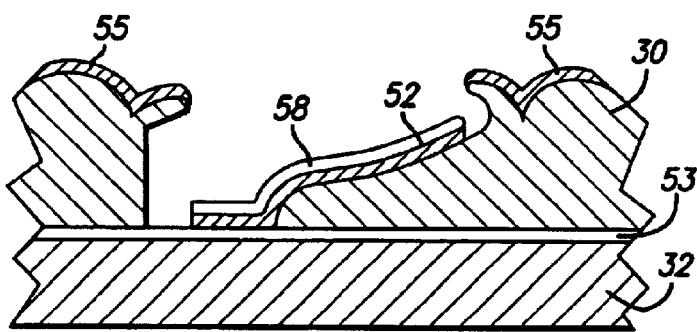
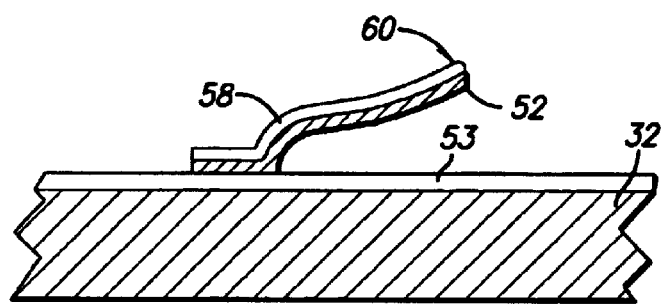
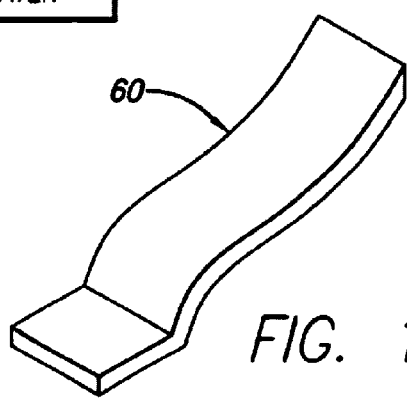

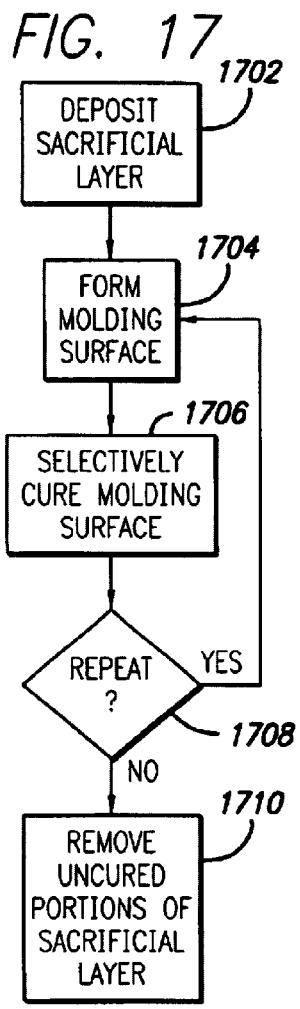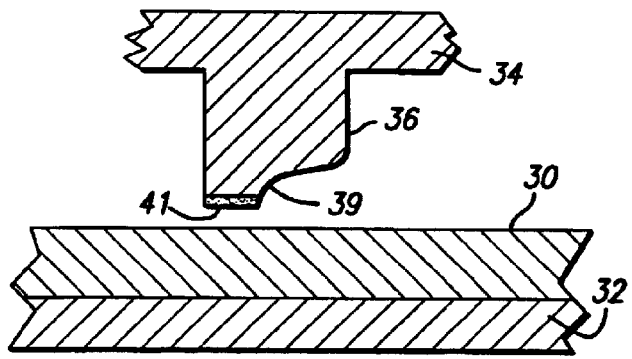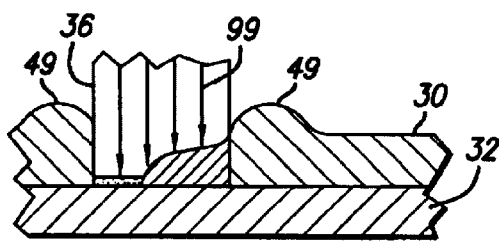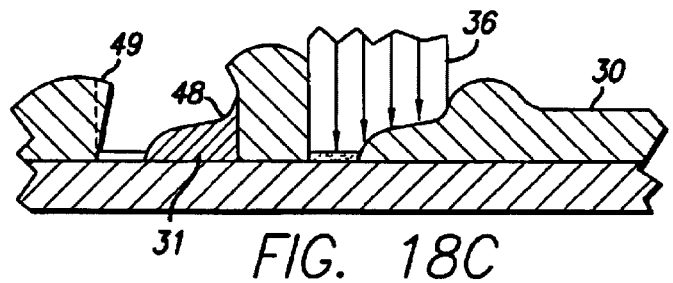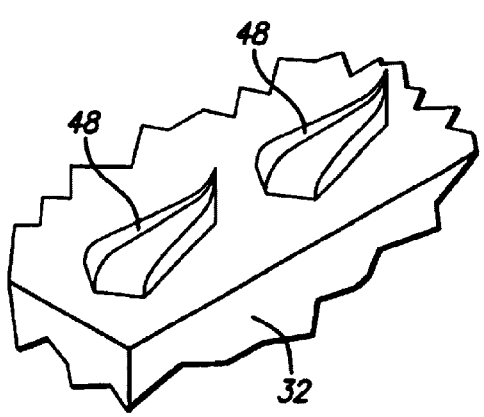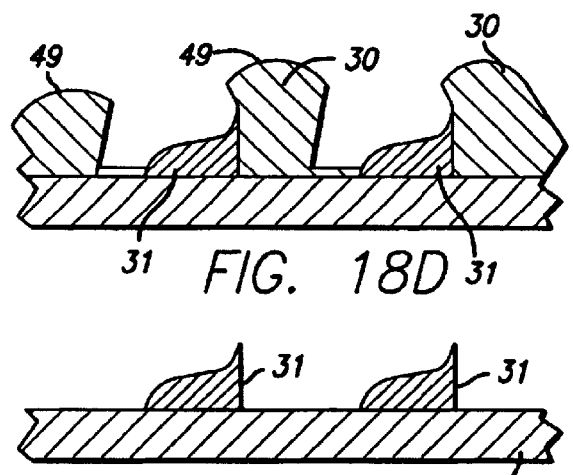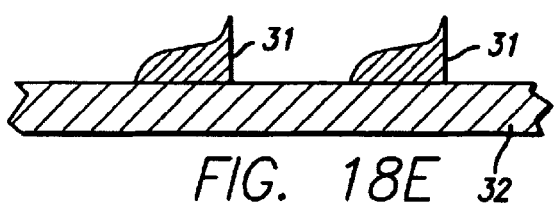

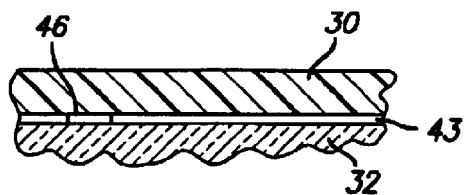
FIG. 21A
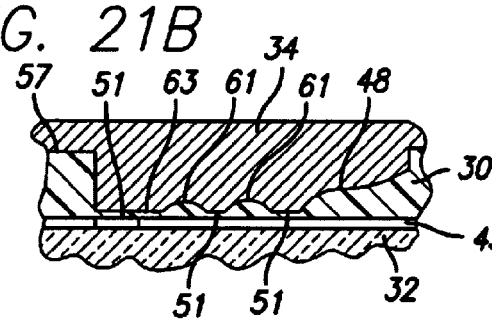
FIG. 21B
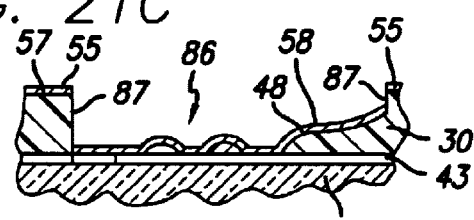
FIG. 21C
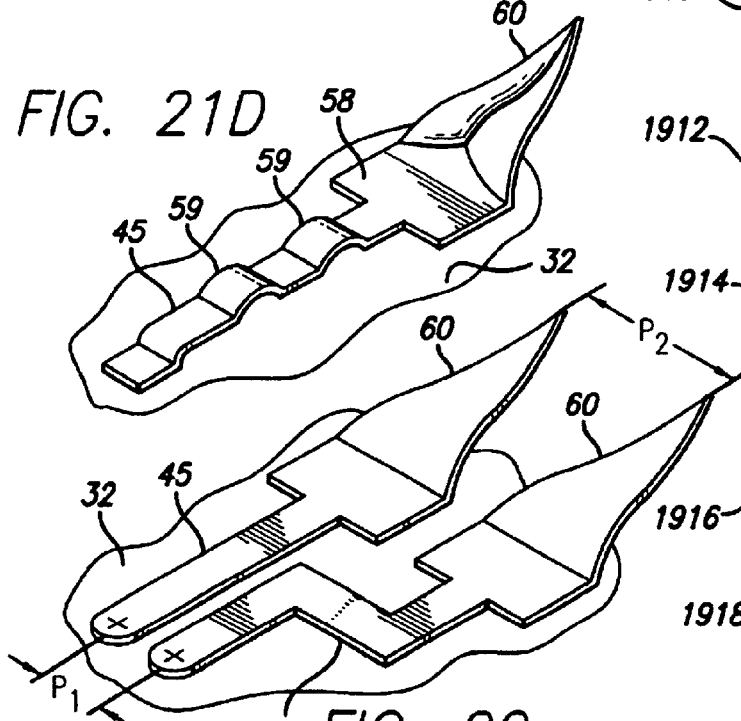
FIG. 21D
FIG. 22
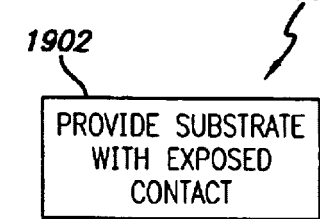
FIG. 19
PROVIDE SUBSTRATE WITH EXPOSED CONTACT
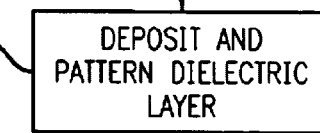
DEPOSIT AND PATTERN DIELECTRIC LAYER
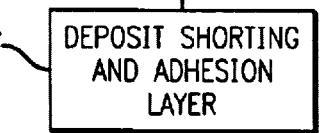
DEPOSIT SHORTING AND ADHESION LAYER
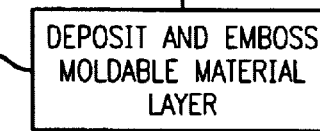
DEPOSIT AND EMBOSS MOLDABLE MATERIAL LAYER
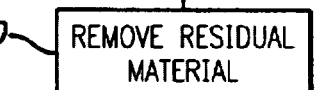
REMOVE RESIDUAL MATERIAL
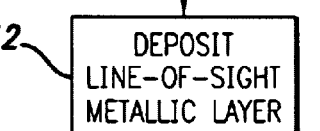
DEPOSIT LINE-OF-SIGHT METALLIC LAYER
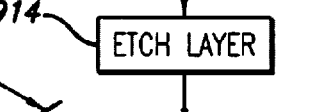
ETCH LAYER
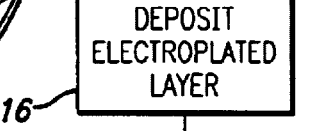
DEPOSIT ELECTROPLATED LAYER
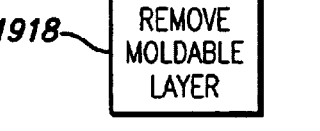
REMOVE MOLDABLE LAYER FIG. 20A
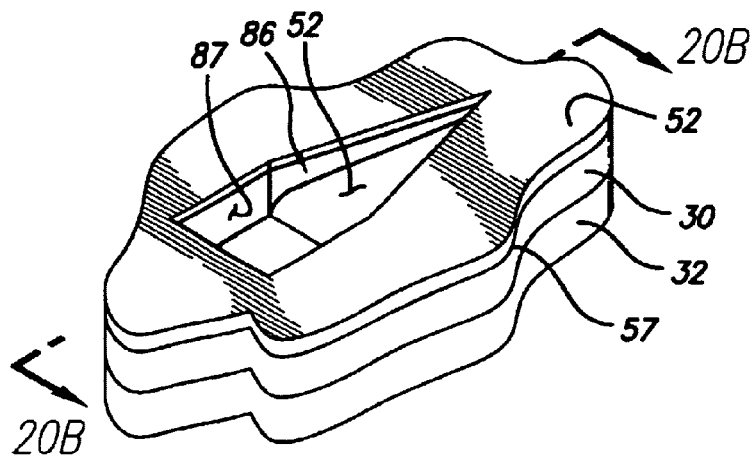
FIG. 20B
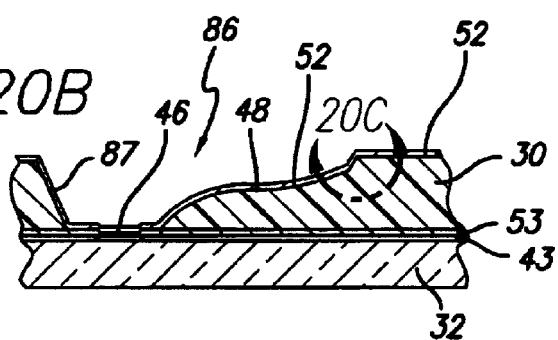
FIG. 20C
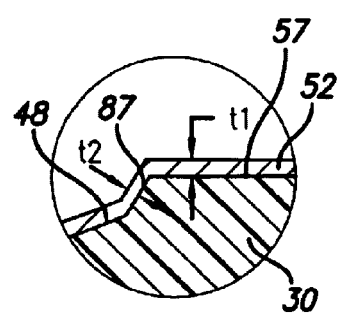
FIG. 20D
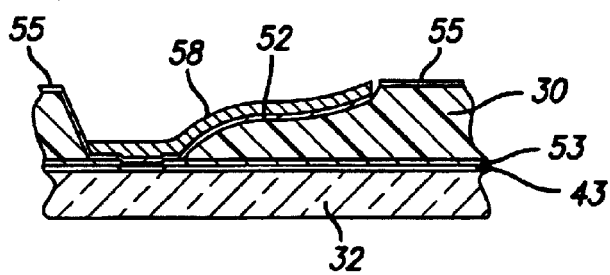
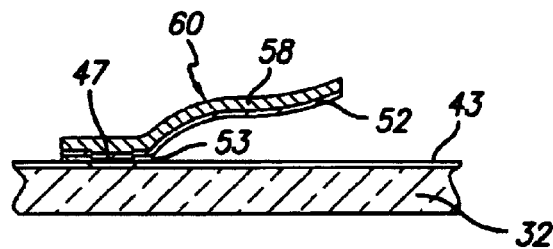
FIG. 20E

METHOD FOR FORMING MICROELECTRONIC SPRING STRUCTURES ON A SUBSTRATE

RELATED APPLICATION

This application is a continuation-in-part of the co-pending U.S. patent application Ser. No. 09/710,539, filed Nov. 9, 2000, entitled "LITHOGRAPHIC SCALE MICROELECTRONIC SPRING STRUCTURES WITH IMPROVED CONTOURS," by Eldridge and Wenzel (hereinafter the "FIRST PARENT CASE"), which is a continuation-in-part of co-pending application Ser. No. 09/364,788, filed Jul. 30, 1999, entitled "INTERCONNECT ASSEMBLIES AND METHODS," by Eldridge and Mathieu (hereinafter, the "SECOND PARENT CASE"), which applications are incorporated herein, in their entirety, by reference.

BACKGROUND OF THE INVENTION

1. Field of the Invention

The present invention relates to electrical contact elements for electrical devices, and more particularly to lithographic-scale, microelectronic spring contacts with improved contours.

2. Description of Related Art

Recent technological advances, such as described in U.S. Pat. No. 5,917,707 to Khandros et al., have provided small, flexible and resilient microelectronic spring contacts for mounting directly to substrates, such as semiconductor chips. The '707 patent discloses microelectronic spring contacts that are made using a wire bonding process that involves bonding a very fine wire to a substrate, and subsequent electroplating of the wire to form a resilient element. These microelectronic contacts have provided substantial advantages in applications such as back-end wafer processing, and particularly for use as contact structures for probe cards, where they have replaced fine tungsten wires. It is further recognized, as described, for example, in U.S. Pat. Nos. 6,032,446 and 5,983,493 to Eldridge et al, that such substrate-mounted, microelectronic spring contacts can offer substantial advantages for making electrical connections between semiconductor devices in general, and in particular, for the purpose of performing wafer-level test and burn-in processes. Indeed, fine-pitch spring contacts offer potential advantages for any application where arrays of reliable electronic connectors are required, including for making both temporary and permanent electrical connections in almost every type of electronic device.

In practice, however, the cost of fabricating fine-pitch spring contacts has limited their range of applicability to less cost-sensitive applications. Much of the fabrication cost is associated with manufacturing equipment and process time. Contacts as described in the aforementioned patents are fabricated in a serial process (i.e., one at a time) that cannot be readily converted into a parallel, many-at-a-time process. Thus, new types of contact structures, referred to herein as lithographic-scale microelectronic spring (or contact, or spring contact) structures, have been developed, using lithographic manufacturing processes that are well suited for producing multiple spring structures in parallel, thereby greatly reducing the cost associated with each contact. Exemplary lithographic-scale spring contacts, and processes for making them, are described in the commonly owned, co-pending U.S. patent applications "LITHOGRAPHI-CALLY DEFINED MICROELECTRONIC CONTACT STRUCTURES, Ser. No. 09/032,473 filed Feb. 26, 1998 by Pedersen and Khandros, and "MICROELECTRONIC CONTACT STRUCTURES", Ser. No. 60/073,679, filed Feb. 4, 1998 by Pedersen and Khandros, both of which are incorporated herein, in their entirety, by reference.

In general, lithographic processes allow for a great deal of versatility in design of spring contacts, which in turn permits numerous improvements over prior art designs. For example, although prior art lithographically formed structures in general typically have essentially flat rectangular cross-sections, contoured non-rectangular cross-sections are desirable for many spring contact applications. For a given thickness of resilient material, a lithographic type spring contact can be made stiffer and stronger by providing it with a suitably contoured, non-rectangular cross section. Other performance benefits may be realized by utilizing various other more complex shapes. However, prior art manufacturing methods are unsuitable for making lithographic type spring contacts with such suitably contoured, non-rectangular cross-sections, and other types of more complex shapes. Additionally, prior methods, for example, as disclosed in the above-referenced U.S. patent applications 09/032,473 and 60/073,679, fabricate the spring structures using a series of lithographic steps, thereby building up a z-component extension (i.e., extension of the spring tip away from the substrate surface) with several lithographic layers. However, the use of multiple layers adds undesirable cost and complexity to the manufacturing process. Layered structures are also subject to undesirable stress concentration and stress corrosion cracking, because of the discontinuities (i.e., stepped structures) that result from layering processes.

A need therefore exists for method of making microelectronic spring structures more quickly and easily by eliminating process layering steps and the associated costs, while providing springs with improved properties, such as improved strength, stiffness, resistance to stress concentration cracking, and elastic range. Additionally, a need exists for a method of making lithographically formed, microelectronic spring structures with defined contoured surfaces and more complex shapes.

SUMMARY OF THE INVENTION

The present invention provides a method for forming microelectronic spring structures and methods to address the foregoing needs, while achieving adequate z-extension without requiring the use of multiple stepped lithographic layers.

The present invention provides a method for fabricating molded microelectronic spring structures, and methods for making and using such structures, using a molded pre-cursor form. In one embodiment, a method is provided for making resilient contact structures. First, a layer of sacrificial material is formed over a substrate. Then, a contoured surface is developed in the sacrificial material, preferably by molding the sacrificial material using a mold or stamp. The contoured surface provides a mold for at least one spring form, and preferably for an array of spring forms. If necessary, the sacrificial layer is then cured or hardened. A layer of resilient material is deposited over the contoured surface of the sacrificial material, and patterned to define at least one spring form, and preferably an array of spring forms. The sacrificial material is then at least partially removed from beneath the spring form to reveal at least one free-standing spring structure. A separate conducting tip is optionally attached to each resulting spring structure, and each structure is optionally plated or covered with an additional layer or layers of material, as desired.

In another embodiment, a method for making a resilient contact structure using the properties of a fluid meniscus is disclosed. First, a layer of material is formed over a substrate. Then, a recess is developed in the material, and fluid is provided in the recess to form a meniscus. The fluid is cured or hardened to stabilize the contoured shape of the meniscus. The stabilized meniscus is then used in the method in the same manner as the molded surface in the sacrificial material.

The method according to the present invention is readily adaptable for use with lithographic manufacturing equipment and processes that are currently available to make large quantities of microelectronic spring structures in parallel. The method is particularly capable for making lithographically formed microelectronic spring contact structures that are low-aspect ratio rectangular in cross-section, and have a z-component extension along a linear or curved slope. The method also provides for shaping springs in plan view, for example, by providing springs with tapered triangular shapes. In particular, the method is capable of forming spring structures over a molded substrate formed in essentially a single process step, thereby reducing the number of processing steps required to form springs with desired shapes. The method additionally provides contoured molding substrates for forming springs with numerous performance improvements. For example, the method may be used to readily form structures having a U-shaped cross-section, a V-shaped cross-section, and/or a rib running along a length of the spring.

A more complete understanding of the method for forming microelectronic spring structures will be afforded to those skilled in the art, as well as a realization of additional advantages and objects thereof, by a consideration of the following detailed description of the preferred embodiment. Reference will be made to the appended sheets of drawings which will first be described briefly.

BRIEF DESCRIPTION OF THE DRAWINGS

FIG. 3A is a perspective view of a substrate having molding surfaces impressed thereon as during an exemplary step of a method according to the invention.

FIG. 3B is a perspective view of a portion of an exemplary stamping tool for use in a method according to the invention.

FIGS. 3C–3G are perspective views of exemplary teeth for use on a stamping tool in a method according to the invention.

FIG. 4 is a flow diagram showing exemplary steps for forming a molding surface according to an embodiment of the invention, particularly suitable for forming spring structures on uneven substrates.

FIG. 9 is a flow diagram showing exemplary steps for forming a spring structure according to an embodiment of the invention suitable for use with PVD and CVD material deposition techniques.

FIGS. 10A–10D are cross-sectional views of a substrate and materials layered thereon during the exemplary ones of the steps shown in FIG. 9.

FIG. 11A is a cross-sectional view of a portion of an exemplary stamping tool having a re-entrant tooth form for creating an impression cavity with an overhanging lip.

FIG. 11B is a cross-sectional view of a typical impression formed by the stamping tool shown in FIG. 11A.

FIG. 12A is a perspective view of an exemplary progressive stamping tool for creating an impression cavity with an overhanging lip.

FIG. 12B is a cross-sectional view of a portion of the stamping tool shown in FIG. 12A.

FIGS. 12C–12D are cross-sectional views of typical impressions formed by the stamping tool shown in FIGS. 12A–12B, during successive steps of a progressive stamping process.

FIGS. 12E–12F are plan views of exemplary impressions formed by the stamping tool shown in FIGS. 12A–12B, after completion of a progressive stamping process.

FIG. 13 is a flow diagram showing exemplary steps for forming a spring structure according to an embodiment of the invention that avoids a masking step by forming a mold cavity with an overhanging lip.

FIGS. 14A–14C are cross-sectional views of a substrate and materials layered thereon during the exemplary ones of the steps shown in FIG. 13.

FIG. 14D is a perspective view of an exemplary spring structure formed by a method as shown in FIG. 13.

FIG. 17 is a flow diagram showing exemplary steps for forming a spring structure according to an embodiment of the invention that uses a radiation-curable substrate.

FIGS. 18A–18E are cross-sectional views of a substrate and materials layered thereon during the exemplary ones of the steps shown in FIG. 17.

FIG. 18F is a perspective view of exemplary molding surfaces formed by a method as shown in FIG. 17.

FIG. 19 is a flow diagram showing exemplary steps for forming a spring structure according to an embodiment of the invention using a line-of-sight deposition method for patterning the resilient material.

FIG. 20A is a perspective view of a substrate and molded material during an exemplary step of the method shown in FIG. 19.

FIGS. 20B–20E are cross-sectional views of a substrate and materials layered thereon during exemplary ones of the steps shown in FIG. 19.

FIGS. 21A–21C are cross-sectional views of a substrate and materials layered thereon during exemplary steps of the method shown in FIG. 19, wherein the electroplating step is omitted; and further shows an embodiment of the invention for forming a spring structure with an integral redistribution trace.

FIG. 21D is a perspective view of an exemplary spring structure with an integral redistribution trace having elevated bridges.

FIG. 22 is a perspective view of a plurality of spring structures having integral redistribution traces, showing an exemplary configuration thereof.

DETAILED DESCRIPTION OF THE PREFERRED EMBODIMENT

Figure 1:
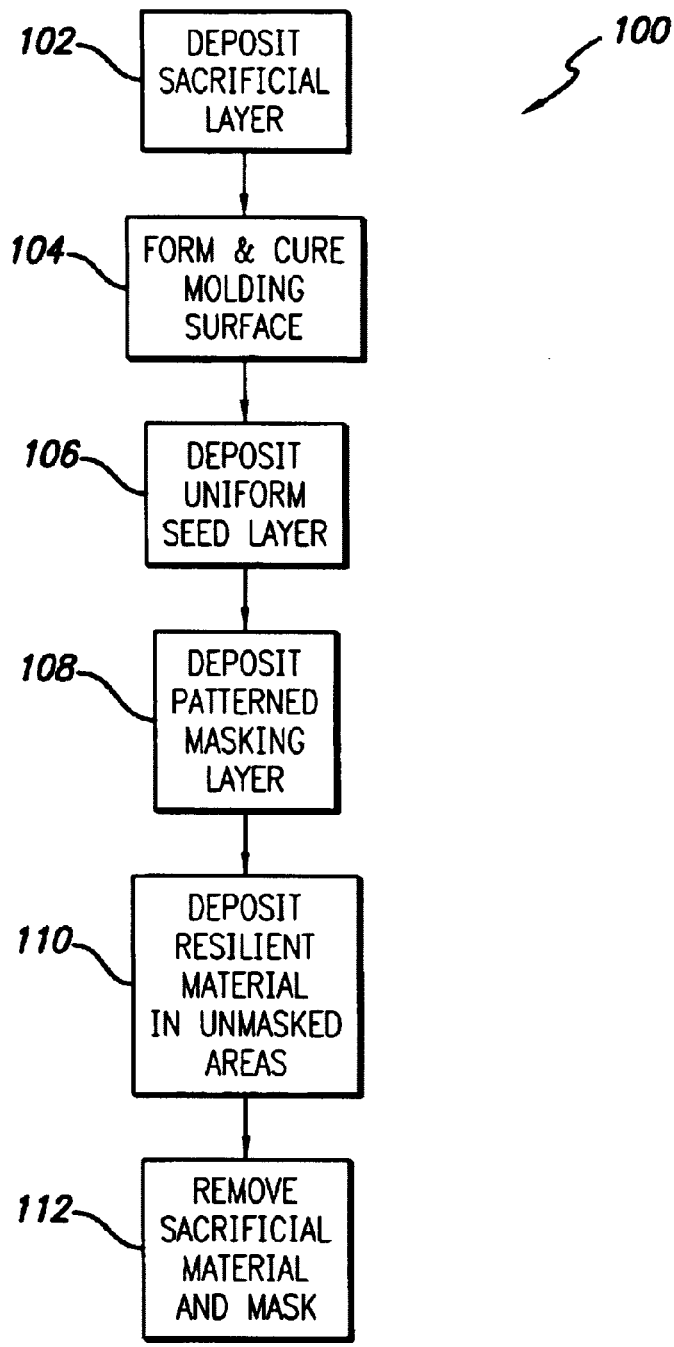
FIG. 1 is a flow diagram showing exemplary steps of a method according to the invention.

The present invention satisfies the need for a method of forming microelectronic spring structures, that overcomes the limitations of previous forming methods. In the detailed description that follows, like element numerals are used to describe like elements illustrated in one or more figures.

Various terms and acronyms are used throughout the detailed description, including the following:

"Microelectronic" means pertaining to that branch of electronics dealing with components of miniature size, such as integrated circuits. A "microelectronic spring" is not limited to springs used as electrical contacts, but also includes springs used as electro-mechanical devices and as purely mechanical springs. "Sacrificial layer," "layer of sacrificial material," and "sacrificial material layer" means a layer of photoresist or similar material that is deposited on a substrate during formation of a desired component or structure, such as a microelectronic spring component, and later removed from the substrate.

"Sacrificial substrate" means a substrate that is used for formation of a desired component or structure, such as a microelectronic spring component, and later removed from the component or structure.

"Substrate" means a material having a supporting surface for supporting a desired structure or component. Suitable substrates upon which microelectronic spring contacts may be formed according to the present invention include, but are not limited to, semiconductor materials, such as semiconductor wafers and dice (with or without integrated circuitry), metals, ceramics, and plastics; all of the foregoing materials may be in various geometric configurations and intended for various applications.

The foregoing definitions are not intended to limit the scope of the present invention, but rather are intended to clarify terms that are well understood by persons having ordinary skill in the art, and to introduce terms helpful for describing the present invention. It should be appreciated that the defined terms may also have other meanings to such persons having ordinary skill in the art. These and other terms are used in the detailed description below.

The present invention provides methods for forming microelectronic springs on a substrate using lithographic techniques that are readily adoptable by manufacturers of semiconductor electronic devices. The microelectronic springs structures are preferably configured as described in the FIRST PARENT CASE referenced above, although various other configurations may also be formed using the methods described herein. Various exemplary methods are disclosed herein, and it should be apparent that the choice of a preferred method will depend on factors such as the type of manufacturing equipment available, the characteristics of the substrate, the desired properties of the springs, and so forth, that will vary depending on the circumstances. In some circumstances, two or more methods may be equally preferable. Additionally, selected steps of the exemplary methods may be combined in various ways, and optional steps may be omitted, depending on these and similar variable factors.

FIG. 1 shows exemplary steps of a generally applicable method according to the invention, and FIGS. 2A–2H show views of a substrate 32, and materials layered thereon, during the steps of the method shown in FIG. 1. In step 102, a layer of sacrificial material 30 is deposited on a surface of a substrate 32, such as an upper surface of a semiconductor device, chip, die, or wafer. Substrate 32 is typically a semiconductor substrate for an integrated circuit having numerous electrical terminals, one of which is shown as the contact pad 46 in FIG. 2A. Contact pads, such as contact pad 46, are typically coupled by conductive traces, such as trace 44, to internal circuitry within the integrated circuit. However, the present invention is not limited for use with a particular type or configuration of substrate. In some embodiments of the invention, contact pad 46 is electrically and mechanically coupled to an intermediate conducting layer (not shown), which is disposed above it. When present, the intermediate layer is typically a manufacturing artifact of a shorting layer used during an electroplating step of a process for forming the microelectronic spring structure. The method 100 may be used to form a spring structure for conduction of electrical signals and/or power between a mating substrate, and contact pad 46.

As known in the semiconductor art, substrate 32 is typically comprised of numerous layers, such as insulating layers interposed with conducting and semiconducting layers, and a passivating layer (not shown) optionally provided on an upper surface of the substrate 32. The passivating layer may be an insulating layer, a polysilicon layer, or other layers as known in the art, and is commonly present on semiconductor devices. When a passivating layer is present, contact pad 46 is preferably exposed through an opening in the passivating layer. Prior to depositing subsequent layers, a passivating layer (if there is one present) may optionally first be roughened, such as by exposure to an oxygen plasma, to enhance adhesion of the first subsequent layer. Choice of roughening techniques and materials suitable for deposition on passivating layers is as known in the art.

Figure 2A:
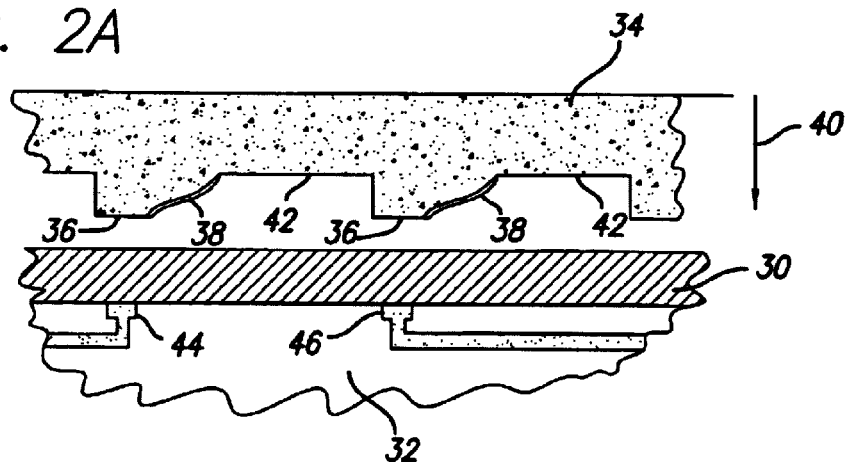
FIGS. 2A–2H are cross-sectional views of a substrate and materials layered thereon during exemplary steps of a method according to the invention.

Referring to FIGS. 1 and 2A, in a preparatory step 102 of a method for making a contoured spring, a substrate 32, optionally provided with a contact pads 46 for connecting to a integrated circuit, is coated with a moldable sacrificial layer 30. Sacrificial layer 30 may be any number of materials, such as PMMA (poly methyl methacrylate), which can be coated on a substrate to the desired thickness, which will deform when pressed with a mold or stamp, which will receive the resilient material to be deposited thereon, and which can then readily be removed without damaging the spring structures formed thereon. Additional candidate materials for layer 30 include acrylic polymers, polycarbonate, polyurethane, ABS plastic, various photo-resist resins such as phenol-formaldehyde novolac resins, epoxies and waxes. The sacrificial layer 30 preferably has a uniform thickness slightly greater than the desired height of the contact tips of the finished spring structure above the substrate 32. For example, if the desired height is 50 microns (about 2 mils), layer 30 may have a thickness of 55 microns (2.2 mils). Various methods known in the art, for example, spin coating, may be used to deposit layer 30 onto substrate 32.

In an embodiment of the invention, layer 30 comprises multiple layers, for example a soft material that is in contact with substrate 32, covered with a hard or brittle material on the top surface that will cleave or cut cleanly when impressed with molding tool 34. This type of bi-layer could be formed with successive addition and curing of wet materials by spin coating or casting, by successive lamination of dry film polymers, or by lamination of a dry film that consists of multiple layers. The brittle layer mentioned above could also be a metallic layer, that would cleave and eliminate the metal layer deposition step required to form a conducting surface, such as step 106 shown in FIG. 1. In yet another embodiment, layer 30 comprises at least one layer of photo-patternable material and at least one layer of moldable material that is not photo-patternable. This would provide, for example, the ability to photo-pattern some regions, then follow the photo-patterning step with a molding step, or vice versa.

Figure 2B:
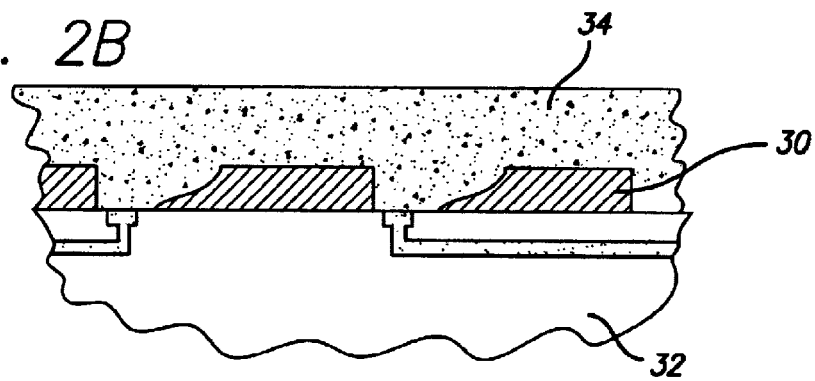

Also, a stamping tool 34, having a molding face provided with different molding regions 36, 38, and 42, is prepared for molding sacrificial layer 30. Various methods may be used to prepare tool 34. For example, the stamping tool 34 may be formed from a relatively hard material using a computer controlled, ultraviolet ("UV") laser ablation process, using an excimer laser, or a pulsed NdYag laser such as are available from Lambda Physik, Inc., located in Fort Lauderdale, Fla., or from Heidelberg Instruments Mikrotechnik GmbH, located in Heidelberg, Germany. In the alternative, a laser microchemical process, also called laser assisted etching, available from Revise, Inc. located in Burlington, Mass., may be used to form the stamping tool. Yet another alternative is to use a gray-scale photolithography mask, such as available from Canyon Materials, Inc., of San Diego, Calif., to form a pattern with a surface profile in a photopatternable glass or a layer of photoresist (which may be used as a mold for the stamping tool). The latter method—using a gray-scale mask to pattern a layer of photoresist—may also be used to form sacrificial layer 30 directly, but this is less preferred because it is generally slower than using a stamping tool. All of the foregoing methods for forming a stamping tool are capable of defining features with submicron resolution, and thus may be used for forming spring structures with molded features to about 0.1 micron in size. For example, a spring structure with a cantilevered beam portion as narrow as about 0.1 microns may be made using method 100. Maximally protruding molding regions, or "teeth" 36 of tool 34 are used for deforming the sacrificial layer 30 in the area of the contact pads 46, where bases of the contact structures will be formed. Contoured molding regions 38 are used for deforming layer 30 in a beam region of the contact structures to be formed. Maximally recessed molding regions 42 are used for receiving excess material, i.e., "flash," pushed aside by teeth 36. Molding regions 42 also define spacing between adjacent spring structures on substrate 32. Depending on the choice of materials for sacrificial layer 30 and stamping tool 34, a layer of mold release material (not shown) is optionally provided on the molding face of tool 34. It should be recognized that further layers and materials may be present on substrate 32 without departing from the method described herein. For example, a metallic shorting layer (not shown) is optionally provided between layer 30 and substrate 32, to protect any integrated circuits embedded in the substrate during processing operations. In an initial phase of forming and curing step 104, the stamping tool 34 is applied against substrate 32 with sufficient pressure to bring the teeth 36 nearly to the surface of substrate 32, and to fully mold layer 30 in all contoured molding regions 48, as shown in FIG. 2B. To avoid damaging substrate 32, and particularly because the surface of substrate 32 is typically not perfectly planar, teeth 36 are preferably not brought into contact with substrate 32. Tool pressures are preferably relatively low, such as less than about 7 mega-Pascals ("MPa", about 1000 pounds per square inch ("PSI")), and more preferably, less than about 0.7 MPa (about 100 PSI). In a preferred embodiment, when teeth 36 have sunk into layer 30 to the desired depth, flash substantially fills the maximally recessed regions 42 forming a surface sufficiently uniform to permit later deposition of a layer of masking material between the spring structures after the stamping tool 34 is removed from layer 30. Stamping tool 34 may be heated to assist deformation of layer 30, and then cooled to harden layer 30 into place. In an alternative embodiment, layer 30 is selected of a material that is sufficiently deformable to flow under pressure without application of heat, and sufficiently viscous to hold its shape after tool 30 is removed. In yet another alternative embodiment, heat, UV light, or chemical catalysts are used to harden sacrificial layer 30 while under stamping tool 34, and then tool 34 is removed. In yet another embodiment, ultrasonic energy is applied by tool 34 to soften layer 30 for molding. Whatever molding technique is used, the cycle times are preferably relatively short to permit faster manufacturing throughput.

Figure 2C:
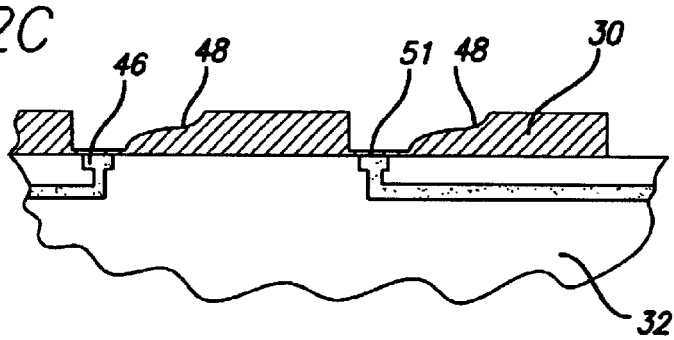

FIG. 2C shows the shape of the sacrificial layer 30 after removal of the stamping tool 34, in a subsequent phase of molding and curing step 104. A thin layer of residue 51 is shown over the area of each contact pad 46; however, in some alternative embodiments, the contact pad 46 is essentially free of residue after removal of the stamping tool. Negative mold surfaces 48 are also present, each bearing a negative impression of the desired contour for the contoured beams to be formed thereon. When present, it is necessary to remove the residue 51 to expose the substrate 32 in the areas 50 where the bases of the contact structures are to be formed. To remove the residue 51, the entire substrate with its molded layer 30 may be isotropically etched by immersion in a bath of wet etchants, by oxygen plasma, or other methods as known in the art. Isotropic etching is suitable for relatively flat substrates for which the residue 51 is of a relatively uniform thickness in all areas 50 on substrate 32. Preferably, the isotropic etch is performed so as to remove the residue 51 while at the same time reducing the thickness of layer 30 to equal the desired height of the spring structures to be formed. In the alternative, an anisotropic etching method that etches more rapidly in a direction perpendicular to the substrate 32, such as reactive ion etching, may be used. An anisotropic etch is preferably used in cases where the substrate is relatively uneven, causing non-uniformity in the thickness of residue 51, or in cases when the lateral dimensions must be held in close tolerance.

Figure 2D:
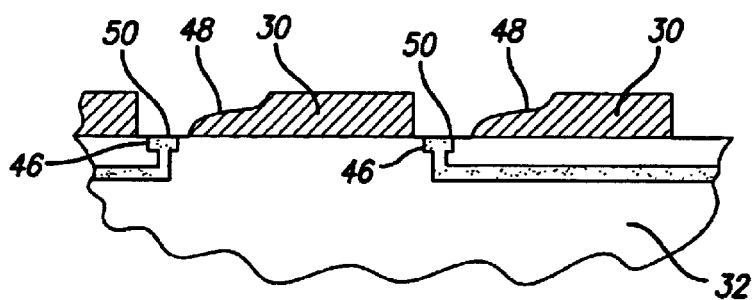

The appearance of the molded sacrificial layer 30 after etching is shown in FIG. 2D, at a later time during forming and curing step 104. The contact pads 46 are preferably exposed, along with a surrounding area of substrate 50 sufficient for providing adhesion of the base of the spring structure to be formed. In typical semiconductor applications, an exposed area of substrate 32 of between about 10,000 and about 40,000 square microns, most preferably in excess of about 30,000 square microns, is provided. After etching, the mold surfaces 48 preferably take on the desired contoured shape, and the ends of all mold surfaces 48 distal from substrate 32 are preferably within substantially the same plane.

In step 106, a seed layer is sputtered over the surface of sacrificial layer 30 and exposed base areas 50. The seed layer is typically a relatively thin layer of uniform thickness, such as about 4500 Å (Angstroms; or about 0.45 microns) thick, of sputtered metal, used for electroplating the resilient spring material. Suitable metals for seed layer 52 include copper, gold, or palladium; or potentially, titanium—tungsten (Ti—W). Less preferably, surface modifications of layer 30 and base areas 50, e.g., plasma treatment, may be used to render them conductive, thereby creating a seed layer in a surface layer of the materials.

In an alternative embodiment, an electrically conductive mold material, such as a conductive polymer, conductive composite material, or metal alloy having a low melting point, is used to form mold layer 30, thereby eliminating the need to deposit a seed layer in preparation for plating. In such an embodiment, the resilient spring material can be plated directly onto the conductive mold material. In addition, the substrate is optionally covered with a protective shorting layer, as known in the art, before the layer of conductive mold material is applied the substrate. The shorting layer, if present, protects any integrated circuit elements in the substrate, and carries the plating current.

Figure 2E:
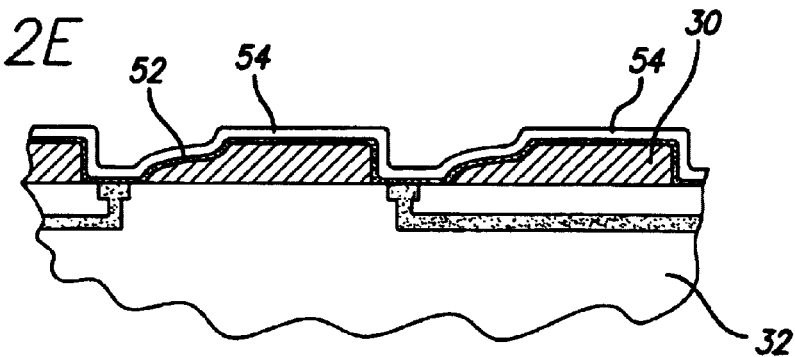

In step 108, a patterned layer of a masking material, such as a photo-resist layer 54, is deposited, to cover areas of the seed layer where no resilient material is to be deposited. The photo-resist layer 54 may be selected from various commercially available resist materials, including wet or dry positive or negative resists, or wet positive or negative electrophoretic resist systems. The photo-resist layer may be patterned using any appropriate method, for example by exposing to UV light through a mask, except where the spring structures are to be formed, thus curing it in the exposed areas (in the case of a negative-acting resist). FIG. 2E shows substrate 32 after application of a seed layer 52 and a photo-resist layer 54. In FIGS. 2E–2H, the relative thickness of seed layer 52 is exaggerated. The uncured portions of photo-resist layer 54 are then dissolved away by a suitable solvent, as known in the art.

The masking material 54 is preferably stable in the environment of subsequent deposition methods. For example, a typical positive photoresist masking material contains residual solvent or monomer that can outgas under the high vacuum conditions present during sputtering operations. Similar difficulties may be encountered when sputtering over a layer of sacrificial material, which typically is an organic material that may also contain residual solvent or other low-molecular-weight constituents. In preparation for a subsequent deposition step, the masking or sacrificial material is preferably pre-treated, for example by baking or by exposure to light, to drive off residual solvent or cross-link residual monomer, as the case may be, or to otherwise stabilize the material. A disadvantage of pre-treating is that the masking or sacrificial material may thereby be made more difficult to remove later in the process. A suitable sacrificial material and deposition process can be selected by one skilled in the art.

Figure 2F:
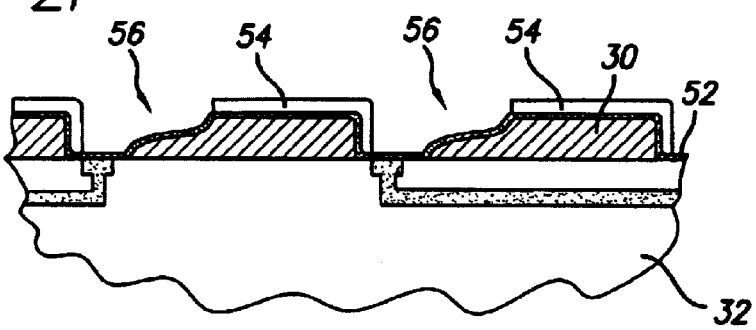
Figure 2G:
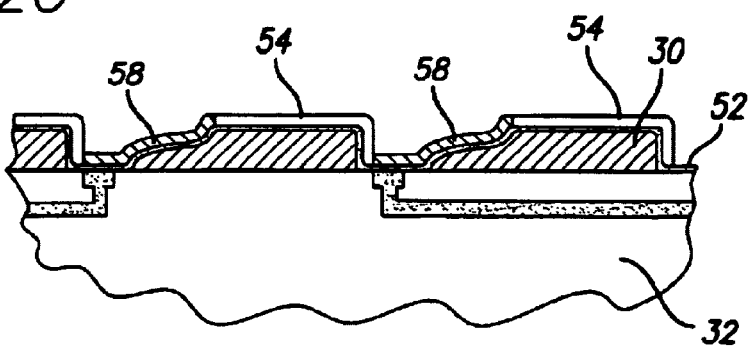
Figure 2H:
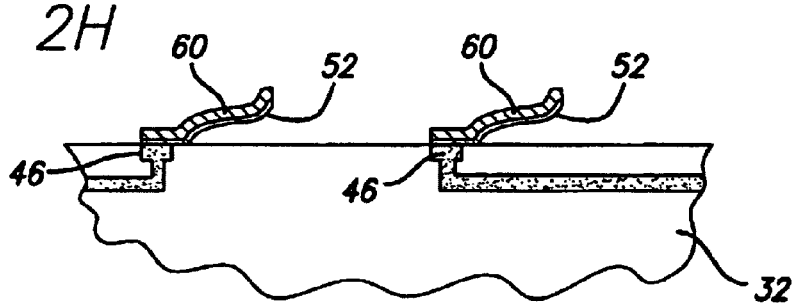

After the uncured portions of resist layer 54 are dissolved away, exposed areas 56 of seed layer 52 are revealed, as shown in FIG. 2F. Exposed areas 56 have the projected shape, in plan view, of the desired microelectronic spring structure. For example, if a triangular beam is desired, the exposed area has a generally triangular shape, in plan view. In step 110, one or more layers of resilient material 58 are then deposited onto the seed layer in the exposed areas 56, using various methods, such as electroplating, as known in the art. Where the seed layer is covered by resist layer 54, no electroplating will occur. In the alternative, a layer of resilient material may be built up using a process such as CVD or PVD selectively applied to areas 56 through a mask (such as a shadow mask), eliminating the need for the step 106 of depositing a seed layer. Using any of various deposition methods, a spring structure 60 comprising an integrally formed base and beam is formed on the exposed area 56, as shown in FIG. 2G. In step 112, the layers of sacrificial material 30 and masking material 54 are removed using a suitable solvent, such as acetone, that will not attack substrate 32 or the resilient material 58, as known in the art. Freestanding spring structures 60, as shown in FIG. 2H, are the result.

Suitable materials for the resilient material include but are not limited to: nickel, and its alloys; copper, cobalt, iron, and their alloys; gold (especially hard gold) and silver, both of which exhibit excellent current-carrying capabilities and good contact resistivity characteristics; elements of the platinum group; noble metals; semi-noble metals and their alloys, particularly elements of the palladium group and their alloys; and tungsten, molybdenum and other refractory metals and their alloys. Use of nickel and nickel alloys is particularly preferred. In cases where a solder-like finish is desired, tin, lead, bismuth, indium, gallium and their alloys can also be used. The resilient material may further be comprised of more than one layer. For example, the resilient material may be comprised of two metal layers, wherein a first metal layer, such as nickel or an alloy thereof, is selected for its resiliency properties and a second metal layer, such as gold, is selected for its electrical conductivity properties. Additionally, layers of conductive and insulating materials may be deposited to form transmission-line-like structures.

After formation of the spring structures 60, substrate 32 is optionally coated in a patterned layer with an insulating encapsulant material over its surface, as further described in the SECOND PARENT CASE referenced above. The encapsulant layer (not shown) preferably covers the base areas 50 of the contact structures, thereby mechanically reinforcing the attachment of the resilient contact structures to the surface of the substrate. In addition, spring structures 60 are optionally provided with separate tip structures. Separate tip structures may be formed on a sacrificial substrate, and transferred to structure 60, to be joined adjacent to its free tip, as is further described, for example, in the commonly owned, co-pending application Ser. No. 09/023,859, filed Feb. 13, 1998, which is incorporated herein, in its entirety, by reference.

It should be apparent that method 100, and variations thereof, may be used to readily form numerous contoured spring structures on a substrate during a single production cycle. For example, method 100 may be used to produce tens of thousands of contoured spring structures on a wafer with multiple dice. Additionally, each of the tens of thousands of structures so formed will have a precise size, shape, and location as defined during the embossing and lithographic manufacturing process. In general, dimensional errors are anticipated to be on the order of 10 microns or less. Because so many structures can be formed at the same time, the cost of forming each structure will be relatively low.

Furthermore, numerous variations of the above-described sequence of steps will become apparent to one skilled in the art, for producing integrally formed spring structures according to the present invention. For example, a spring contact structure may be fabricated at an area on a substrate that is remote from a contact pad to which it is electrically connected. Generally, the spring contact structure may be mounted to a conductive line (not shown) that extends from a contact pad of the substrate to a remote position. In this manner, a plurality of spring contact structures can be mounted to the substrate so that their tips are disposed in a pattern and at positions that are not limited to the pattern of the contact pads on the substrate. Additionally, in an embodiment of the invention, molds for both the desired spring structures and the redistribution layer are formed simultaneously, by impressing a suitably shaped stamping tool into the moldable substrate. In yet another embodiment, molds for spring contacts are formed on opposite or adjacent surfaces of substrates, which is useful, for example, for forming interposer or space-transformer components. Such molds can be formed either sequentially or simultaneously, with appropriate tooling.

For further example, method 100 may further be adapted to permit the resilient material to be permanently deposited in areas of the substrate that are not specifically intended for making interconnections. Generally, any area on the substrate that is not masked will be plated. This may be useful for, e.g., building mechanical elements on the face of the die for standoffs. For example, the edges of the substrate could be plated to provide stand-offs or stop structures for spring structures 60. Alternatively, the opposite side of the substrate can be plated with a shielding or shorting layer. Variations such as the foregoing may similarly be made in each of the alternative methods disclosed herein.

Although various adaptations may be made to the methods disclosed herein, in general, a molding or other forming process using a relatively thick layer of sacrificial material, such as layer 30, is preferred for providing adequate height of the spring structure without requiring building up of multiple layers of photo-resist. Additionally, use of a deformable (moldable) sacrificial material layer facilitates duplication and mass production of relatively complex, contoured beam shapes.

Accordingly, in the preferred embodiments of the method, the entire spring structure (with the exception of optional features such as separate tips) is definable in a layer of material deposited (such as by electroplating, CVD, or PVD) on the surface of a mold form. The resulting spring structures are thus comprised of an integral sheet, which may comprise a single layer, or multiple coextensive layers, of resilient, conductive, and/or resistive material. The integrated sheet may be folded and contoured, and is preferably essentially free of any overlapping portion in the direction that the materials are deposited (typically from above the structure towards a substrate), so it may be more readily formed by depositing a layer or layers of material over a molded layer of sacrificial material, according to the methods described herein. However, substantial overlap may be achieved using some deposition methods, such as electroplating in conjunction with a "robber" to drive electrically charged material under an overhang.

It should be apparent that the open molding method 100 according to the present invention may be adapted to form contoured beams for spring structures in a wide variety of shapes and sizes. For the purpose of microelectronic spring contact structures, certain sizes and structural properties are preferred, as further described in the FIRST PARENT CASE referenced above. However, method 100 is capable of forming structures both smaller and larger than in the preferred ranges. Current available techniques for forming stamping tools place a lower limit on feature size at about 0.1 micron. While there is no clearly defined upper limit on feature size, above a certain feature size, for example, features that require forming the sacrificial layer 30 to depths of greater than about 10,000 microns (about 1 cm or 400 mils), prior art fabrication methods, such as sheet metal forming, are likely to be more economically feasible.

A perspective view of an exemplary impression formed by a stamping tool is shown in FIG. 3A. A similar view of an exemplary portion of a stamping tool used for making the impression is shown in FIG. 3B. It should be appreciated, however, that the impression need not define or correspond to the plan shape of the desired spring structure, because the desired plan shape may be defined using a pattern mask. The impression need only define the desired contour in the z-direction for the spring structure to be formed. In alternative embodiments of the invention, the plan shape of the impression—e.g., a recess formed in the moldable substrate—may be used to define the spring shape. Exemplary ones of these embodiments are described in more detail later in the specification.

As shown in FIG. 3B, a plurality of teeth 36 are arranged on a face 35 of stamping tool 34, each having an identical contoured surface 38, corresponding to a molding surface 48 formed in layer 30 on substrate 32. The teeth 36 may be arranged in a rectangular array, or in any pattern desired on face 35. Teeth 36 may be made substantially identical to each other, or may comprise various different shapes on the same stamping tool 34, depending on the desired spring structures to be formed. Exemplary tooth shapes include a tooth 36 with a ribbed surface, for forming a ribbed beam of a spring structure, shown in FIG. 3C; a tooth 36 with a corrugated surface 64 shown in FIG. 3D, for forming a corrugated beam; and a tooth 36 with a V-shaped surface 66 shown in FIG. 3E, for forming a V-shaped beam. Teeth may additionally be shaped differently to form spring structures having various shapes in plan view. For example, FIG. 3C shows a tooth for forming a spring structure with a beam and base that are both rectangular in plan view; FIG. 3D shows a tooth for forming a rectangular beam and a semi-elliptical base; and FIG. 3E shows a tooth for forming a triangular beam and semi-elliptical base. An exemplary tooth 36 for forming a structure with a beam that is U-shaped in plan view is shown in FIG. 3F; and an exemplary tooth 36 for forming a bifurcated beam with parallel arm is shown in FIG. 3G. Advantages and characteristics of various contoured spring structures are described in the FIRST PARENT CASE referenced above. It will be apparent that the desired shape of tooth 36 will be defined by the molding counterpart of the desired spring structure shape.

Furthermore, although a specific configuration of stamping tool 34 is shown in FIG. 3B, it should be apparent that tool 34 (and therefore, the impression made by it) may be provided in various configurations, without departing from the scope of the invention. For example, tool 34 may comprise as few as a single embossing tooth. In the alternative, tool 34 may comprise a plurality of embossing teeth 36, disposed in a pattern. In such case, the embossing teeth may be positioned for forming molds on an entire surface of a substrate, or on a selected portion of a substrate surface. In a tool 34 having a plurality of embossing teeth 36, all of the teeth may have the same size and shape. Alternatively, teeth on the same tool may have various different sizes and shapes, depending on the application requirements. The embossing teeth 26 may be disposed in the same plane, or disposed in different planes, or disposed on a curved surface, such as a cylinder. For example, a cylindrical stamping tool may be used to form molding surfaces by rolling over a substrate, which may be useful, for example, for forming spring structures on continuous webs of material.

In many cases, the upper surface of the silicon substrate will have substantial irregularities (non-planarities) that will transfer to the upper surface of a uniform layer of sacrificial material, such as a spin-coated layer. The tips of the spring structures formed by the foregoing molding method will accordingly not be in substantially the same plane. If the irregularities are larger than about 10% of the tip height of the spring structures above the substrate, an array of spring structures on the substrate will be unsuitable for making contact with another planar substrate. Also, because mating substrates will also have non-planar surfaces, it is desirable to reduce non-planarities in the tips of the spring structures to avoid errors from tolerance build-up. Accordingly, the present invention provides a method 400 for making spring structures with tips in substantially the same plane, relative to surface irregularities in a substrate.

Exemplary steps of the method 400 are shown in FIG. 4, and cross-sectional views of a substrate and layered materials during steps of the method are provided in FIGS. 5A–5G. In an initial step 402, a substrate 32, having an irregular upper surface 33, is mounted in a mold 71, comprising a cover plate 68, spacers 70, a mounting surface 74, and an injection port 72. An inner surface 77 of cover plate 68 is planarized to the desired tolerance and polished to the desired surface finish. Substrate 32 is mounted to mounting surface 74, for example, a wafer chuck, so that the upper surface 33 of substrate 32 is substantially parallel to the inner surface 77. The depth of the sacrificial layer 30 to be formed in mold 71 is controlled by the thickness of spacers 70.

Figure 5A:
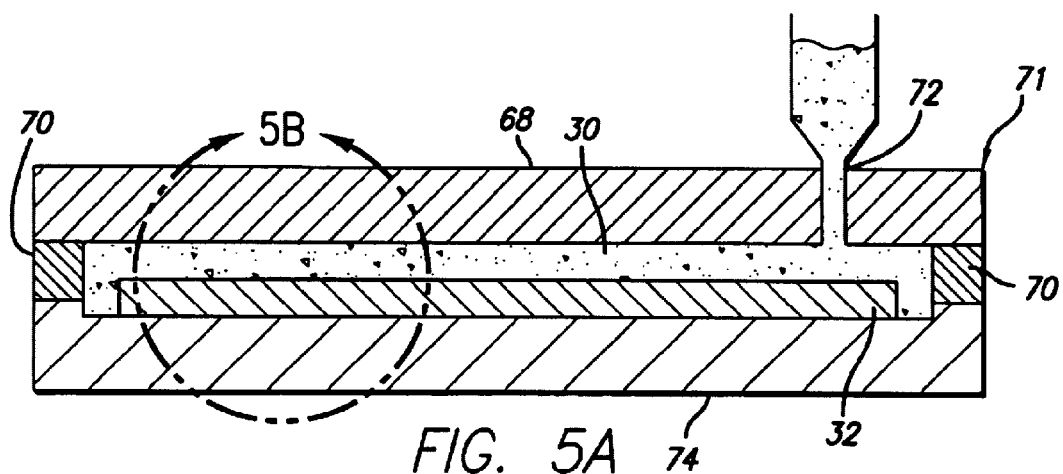
FIGS. 5A–5G are cross-sectional views of a substrate and materials layered thereon during exemplary steps of an embodiment of the invention, particularly suitable for forming spring structures on uneven substrates.
Figure 5B:
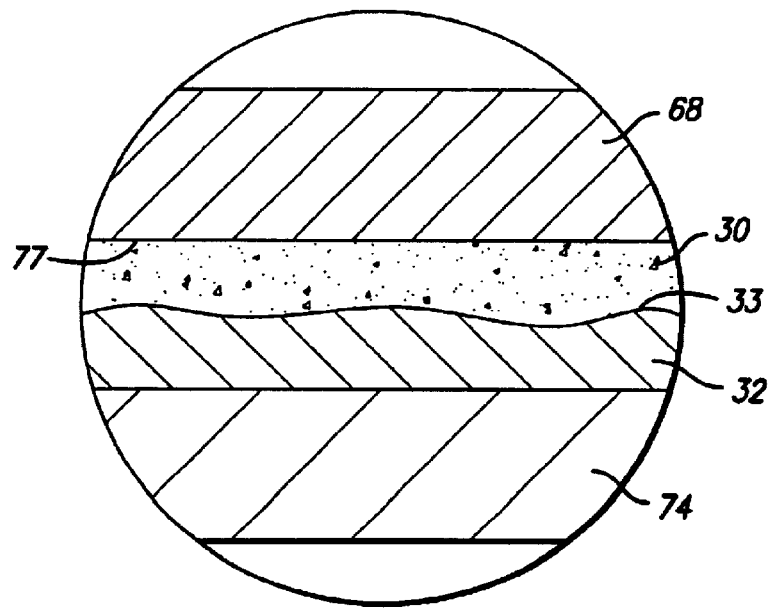
Figure 5C:
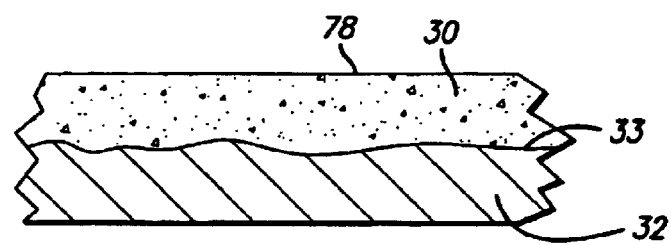
Figure 5D:
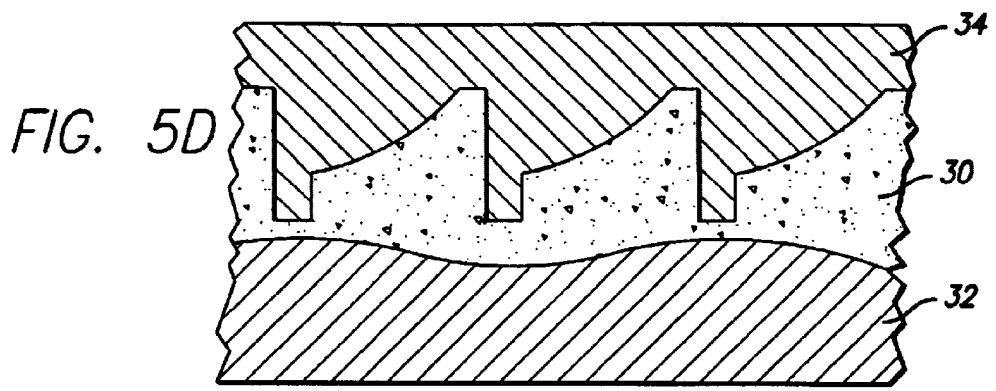
Figure 5E:
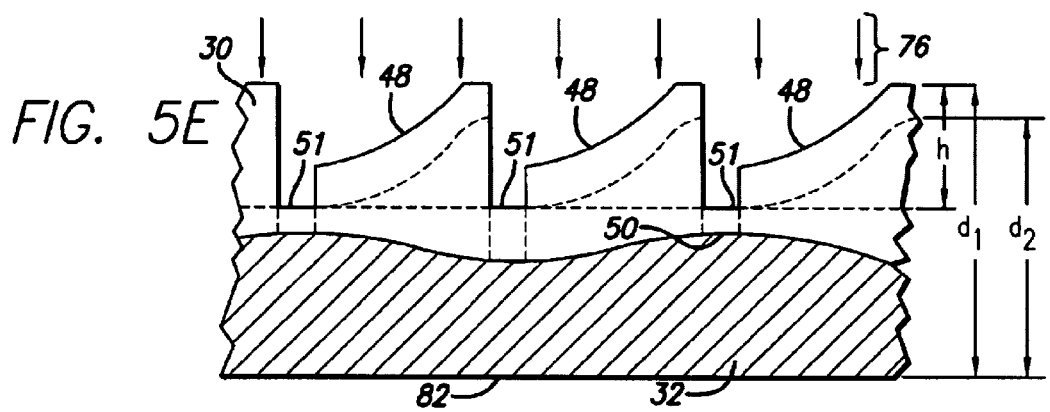
Figure 5F:
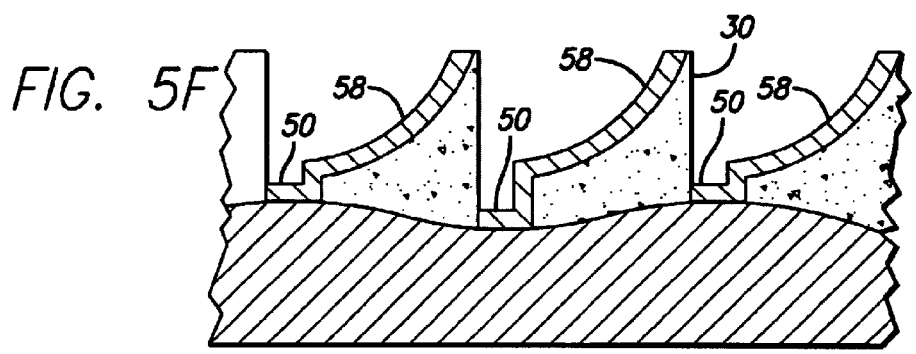
Figure 5G:
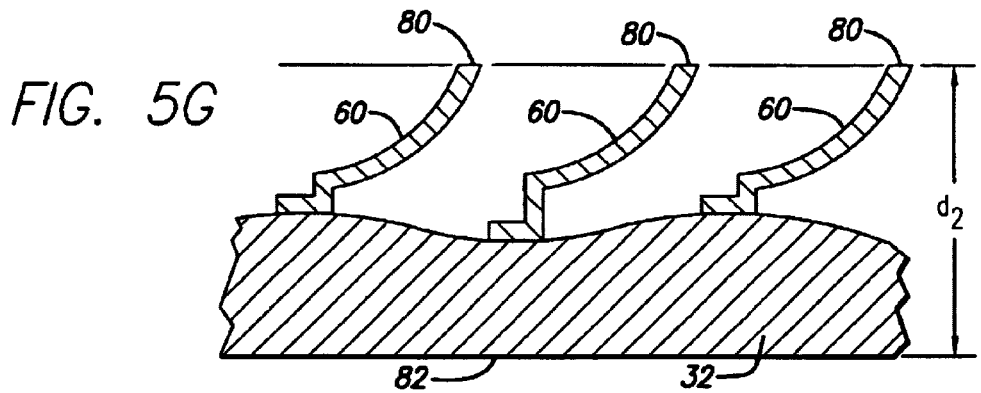

In step 404, a moldable material (for forming sacrificial layer 30) is injected through port 72 to fill the interior of mold 71. The moldable material may be any suitable moldable material, including the materials previously described for forming a coated sacrificial layer. In step 406, the material is cooled or cured to the desired hardness. In step 408, the cover plate 68 is removed from the substrate 32 with the adhered layer 30, as shown in FIG. 5C. After the molding process, the upper surface 78 of layer 30 is substantially planar relative to the irregular upper surface 33 of substrate 32. In step 410, contoured molding surfaces are formed in sacrificial layer 30, using a stamping tool 34, as shown in FIG. 5D. Details of step 410 are essentially the same as step 104 of method 100, described above. In the alternative, features for forming the contoured molding surfaces 48 can be machined directly into inner surface 77 of cover plate 68, and step 410 may be omitted. The appearance of the molded sacrificial layer after forming the molding surfaces 48 is shown in FIG. 5E. The upper surface of residue 51 over base areas 50 are located at a uniform depth h from the reference plane defined by the inner surface 77 of cover plate 68. The reference plane is itself located a distance $d_1$ from the mounting plane 82 of substrate 32, where $d_1$ is longer than h.

In step 412, the substrate is exposed at the base areas 50, preferably by etching the sacrificial layer 30 using an anisotropic etch 76, as previously described. The etch 76 is continued until all substrate areas are exposed, as shown by the dotted lines in FIG. 5E. Conventional end-point detection techniques can be used to determine the ending point for the etching process. After etching, the base areas 50 are disposed on the irregular upper surface 33, and thus are no longer disposed at an equal depth from the reference surface. However, the upper surface of layer 30 is still within essentially the same plane, disposed at a distance $d_2$ from the mounting plane 82 of substrate 32, where $d_2$ is less than $d_1$. A layer of resilient material is then deposited over the sacrificial layer and patterned, and the sacrificial layer is removed from the substrate 32, as previously described in connection with method 100. The resulting spring structures 60 have their tips 80 disposed in substantially the same plane, located a distance $d_2$ from the mounting plane 82 of substrate 32. The distance $d_2$ is preferably constant, but may vary in a regular fashion across any straight section of the substrate (that is, the plane of the spring structure tips need not be exactly parallel to the mounting plane of substrate 32), within limits of about 20% of the average tip height of the spring structures 60 above substrate 32.

Figure 6:
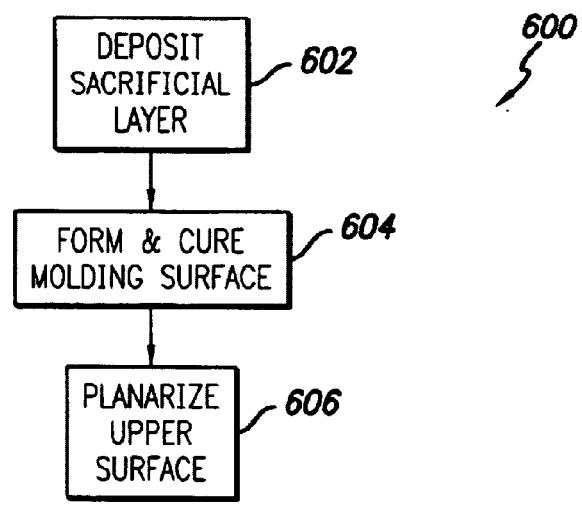
FIG. 6 is a flow diagram showing exemplary steps for forming a molding surface according to an embodiment of the invention, also suitable for forming spring structures on uneven substrates.

Similar results may be obtained using an alternative method 600, exemplary steps of which are shown in FIG. 6. In step 602, a sacrificial layer is deposited on the substrate as previously described in connection with step 102 of method 100. In step 604, a molding surface is formed in the sacrificial material layer, as previously described in connection with step 104. Then, at step 606, the upper surface of the sacrificial material layer is made planar, using a process known in the art, such as chemical-mechanical polishing. As previously described in connection with method 400, the upper surface of the sacrificial layer is thus made to be disposed within a plane that is substantially parallel to, or slightly inclined to, the mounting plane of substrate 32. The remaining steps of method 600 are essentially the same as previously described in connection with steps 106–112 of method 100.

Figure 7:
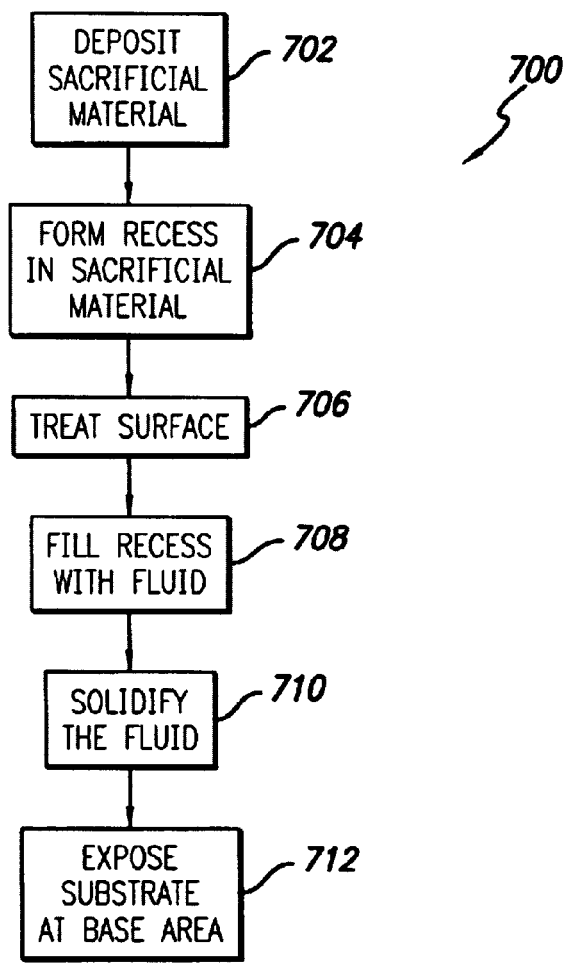
FIG. 7 is a flow diagram showing exemplary steps for forming a molding surface according to an embodiment of the invention, using a fluid to shape a molding surface in the form of a fluid meniscus.
Figure 8A:
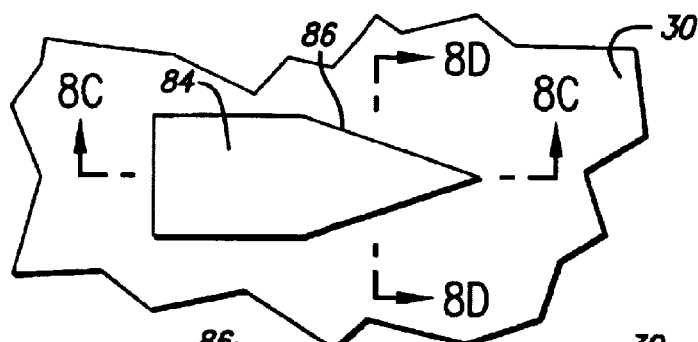
FIG. 8A is a plan view of a substrate and materials layered thereon during an exemplary one of the steps shown in FIG. 7.
Figure 8B:
FIGS. 8B–8F are cross-sectional views of a substrate and materials layered thereon during the exemplary steps shown in FIG. 7.

In some circumstances it may be advantageous to avoid forming the molding surfaces on a sacrificial layer by a method that requires a stamping tool and ancillary equipment. The present invention provides a method 700 for forming contoured molding surfaces in a sacrificial layer without the need for a stamping tool. Exemplary steps of method 700 are shown in FIG. 7. Related views of a substrate with layered materials during steps of the method 700, and a view of an exemplary resulting spring structure, are shown in FIGS. 8A–8G. In an initial step 702, a layer of sacrificial material 30 is deposited on a substrate 32. Sacrificial layer 30 is preferably deposited in a layer of uniform thickness, using any of the methods previously described. In step 704, the layer of sacrificial material is patterned to form one or more recesses 86, as shown in FIG. 8B, extending to the surface of substrate 32 in at least a portion of the recess 86. Various methods as known in the art, such as photo patterning, may be used to form recess 86. In plan view, such as shown in FIG. 8A, recess 86 has the shape of the spring structure to be formed, which may be any of the shapes previously described, or any other suitable shape. For example, in an embodiment of the invention, the beam shape is triangular in plan view, and the base area is rectangular, as shown in FIG. 8A.

In step 706, the surfaces of the recess 86, and in particular, the sidewalls, are preferably treated to alter their wetting properties as desired. The wetting properties can be modified by various techniques as known in the art, such as silanization. For further example, exposure to plasmas of oxygen, nitrogen/hydrogen, and other gases can change surface wetting properties. Further, increasing the surface roughness will generally increase the wetability of the surface. The sidewalls of the recess 86 are treated to alter the surface energy, which determines wetability, relative to the chosen wetting fluid. If a concave meniscus is desired, the surface energy of the sidewalls is decreased (if necessary) such that the chosen wetting fluid will cling to the sidewalls and form a concave meniscus in the recess 86. Conversely, if a convex meniscus is desired, the sidewalls are treated to repel the wetting fluid, thereby causing the fluid to form a bead having a convex meniscus. In the preferred embodiment of the invention, the selection of the sacrificial material, wetting fluid, and recess shape are such that no surface treatment of the recess 86 is needed to achieve the desired meniscus shape. In general, it is preferred that the surface of the recesses 86 be easily wetted, to avoid difficulties with filling multiple recesses with a uniform quantity of fluid.

In step 708, recess 86 is partially filled with a suitable wetting fluid 84. A suitable fluid is one with a low enough viscosity and surface tension to wet recess 86, which may be solidified without significant shrinkage or otherwise distorting the desired meniscus shape, and which may be later removed from the substrate 32 dissolution along with layer 30. In an embodiment of the present invention, fluid 84 is a photo patternable material such as photoresist (e.g., SU8-25 or SU8-2). Several methods may be used to get a specified volume of fluid 84 into the recess 86. Generally the recesses 86 are small, for example about 250 microns wide, 250 microns deep, and 1000 microns long. The volume of a "Manhattan" (rectangular) cavity with these dimensions is 62.5 nanoliters, and special techniques must be used to accurately deposit a specified volume of liquid, which is preferably less than the recess volume. In one embodiment, a substrate having recesses 86 with a volume of less than about 100 nanoliters is spin coated with a fluid 84. The spin-coating process leaves a small amount of fluid 84 in each cavity, the volume of which depends on the fluid viscosity, surface wetting properties of the fluid 84 and recess 86, the shape of recess 86, and spin process parameters such as rotational velocity and acceleration, and radial distance from the axis of rotation. Fluid 84 may be applied by directing (such as by spraying) a fluid mist onto a rotating substrate, or by immersion. A portion of the fluid 84 is also removed by the spin coating process from recess 86, so that the fluid 84 only partially fills the recess 86, as shown in cross-section in FIG. 8C.

Figure 8C:
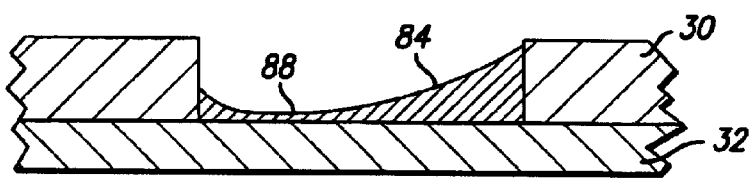
Figure 8D:
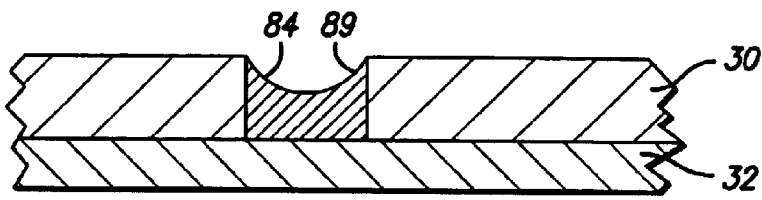

The relative surface energies of fluid 84 and the sidewalls of recess 86 are such that the fluid 84 has a meniscus having a first contoured shape 88 in the length direction of the recess 86, and a second contoured shape 89 in the width direction, as shown in FIGS. 8C and 8D, respectively. Where recess 86 is narrower, such as toward the point of the triangle shown in FIG. 8A, the surface tension of fluid 84 preferably causes surface 88 to rise, as shown in FIG. 8C. Across the width of recess 86, surface tension pulls the surface 89 into a concave U-shape.

Figure 8E:
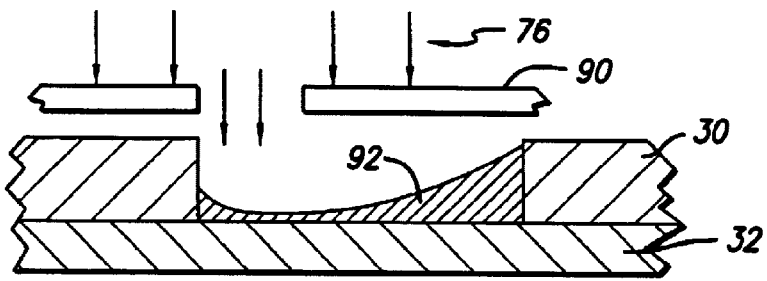
Figure 8F:
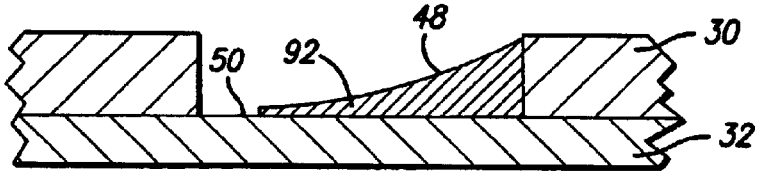
Figure 8G:
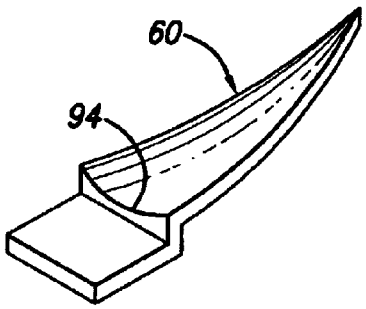
FIG. 8G is a perspective view of an exemplary spring structure formed using the exemplary steps shown in FIG. 7.

In step 710, after the fluid 84 partially fills recess 86, the fluid is solidified, for example, by curing with a chemical catalyst or UV light, by heating to drive out solvents, or by cooling below its melting point. The solidified fluid 92 may then be further patterned to define a mold for the spring structure. For example, as shown in FIG. 8E, a portion of the solidified fluid 92 may be removed in a base area 50, by exposing the solidified fluid 92 to an anisotropic etch 76 through mask 90. The remaining solidified fluid 92 defines a contoured molding surface 48 and exposed base area 50 as shown in FIG. 8F, upon which a suitable resilient material may be deposited according to the previously described method 100, or other suitable method. The resulting spring structure has a beam with a U-shaped contour across its width, as shown in FIG. 8G.

Each of the foregoing fabrication methods may be used to define a spring structure having a defined contoured shape. In general, one of the advantages of contouring the beam of a spring structure is that a contour can be used to reduce the thickness of material that is needed to achieve a beam of adequate stiffness for use as a microelectronic spring contact. Accordingly, alternative deposition techniques, such as physical vapor deposition ("PVD") or chemical vapor deposition ("CVD"), can be used to deposit the resilient spring material over the molding surface. For example, PVD and CVD are generally less suitable than electroplating for depositing layers more than 5 microns thick, which is a suitable range of thickness for contoured springs. The present invention accordingly provides a method 900 for forming a microelectronic spring structure using an alternative material deposition technique, as shown in FIG. 9. Views of a substrate and materials layered thereon during exemplary steps of method 900 are shown in FIGS. 10A–10D.

Steps 902 and 904 of method 900, for depositing a sacrificial layer 30 on substrate 32, and forming the molding surfaces, are substantially the same as corresponding steps 102 and 104 of method 100, as previously described. Other methods, such as method 400 also described herein, may also be used to form a molding surface in the sacrificial material. At step 906, the surface of the sacrificial layer 30 is coated with a layer of resilient material 58 using a process such as CVD or PVD, to a uniform thickness of at least about one micron, and preferably about five microns. To achieve a thickness greater than about 5 microns, it is preferred to deposit the resilient material 58 by electroplating, after first depositing a seed layer, as described in connection with method 100. A cross-section of the substrate after the deposition process is shown in FIG. 10A. In step 908, a patterned layer of masking material, such as a photo-resist layer 54, is applied to cover the resilient material in areas where spring structures are to be formed, as shown in FIG. 10B. At step 910, the excess (unmasked) resilient material is removed using a etching process as previously described, resulting in the layered materials as shown in FIG. 10C. At step 912, the sacrificial layer 30 and masking layer 54 are removed in a suitable solvent, leaving the spring structure 60, comprised of resilient material 58, adhered to substrate 32. Spring structure 60 is then typically post-processed, for example, by plating with gold and/or by adhering a separate tip structure (not shown), as further described herein and in the co-pending applications referenced herein.

The steps required to pattern layers of resilient materials and/or seed layers may be reduced or eliminated by providing at least a portion of the molding surfaces and base areas with an overhanging lip. Such techniques may be generally applied to the methods previously described to reduce manufacturing costs. An overhanging lip may be provided using a mold tooth of suitable form, such as the re-entrant tooth 98 provided on tool 34 and shown in FIG. 11A. When re-entrant tooth 98 is pressed into a layer of sacrificial material, the recess formed thereby is provided with an overhanging lip 96. It should be apparent that, to remove tooth 98 from layer 30 after being fully impressed therein without damaging lip 96, it is helpful for the layer of sacrificial material 30 to be a visco-elastic material. A visco-elastic material will deform sufficiently to permit removal of tooth 98 without damaging lip 96, but will recover its shape after the tooth is removed. Similar benefits may be realized if layer 30 is formed from a soft, elastic material that does not adhere to tool 34. Generally, layer 30 should comprise a solid material with a low shear modulus, i.e., a gel. The gel may have a viscous component, making it visco-elastic, or it may be more purely elastic, e.g., a soft elastic material.

As an alternative to using a re-entrant tooth, progressive stamping tools may be used to form an overhanging lip. FIG. 12A shows an exemplary progressive stamping tool, having a primary tooth 36 and a secondary tooth 37. Primary tooth 36 is shaped as previously described. Secondary tooth 37 is shaped as a relatively shallow ring that partially or fully encloses the perimeter of the recess formed by tooth 36. A cross-sectional view of primary tooth 36 and a representative portion of secondary tooth 37 are shown in FIG. 12B. The primary and secondary teeth are designed to be sequentially impressed on substrate 30 by first impressing the primary tooth 36, lifting the tool 34 from the sacrificial material 30, relocating the stamping tool 34 so that secondary tooth 37 is positioned over the recess formed by the primary tooth, and impressing the tool a second time. In the alternative, the primary and secondary teeth may be provided on separate stamping tools (not shown) which are then applied in sequence to the sacrificial layer 30. It should be apparent that progressive stamping is not limited to use with two progressive tools, and any number of sequential impression tools may be used without departing from the scope of the invention.

The resulting impressions formed by sequential impression of the primary and secondary teeth are shown in FIGS. 12C–12F. FIG. 12C shows a cross-section of an exemplary layer of sacrificial material 30 after being impressed with primary tooth 36. FIG. 12D shows the same exemplary material layer 30, after the progressive stamping tool 34 is shifted a distance and re-impressed upon the material, forming an overhanging lip 96 around the perimeter of the molding surface 48 and base area 50. The sequence may be repeated to provide the next recess formed by the primary tooth 36 with an overhanging lip, and so forth, as the tool 34 progresses across the surface of the material layer 30. A plan view of an exemplary triangular/rectangular recess 86 with an overhanging lip is shown in FIG. 12E, and a similar rectangular recess 86 is shown in FIG. 12F.

A fully enclosing overhanging lip, as shown in FIGS. 12E and 12F, may be used to pattern a layer of resilient material according to the method 1300, shown in FIG. 13. Cross-sectional views of the substrate and layered materials during steps of the method 1300 are shown in FIGS. 14A–14C. In an initial step 1302, a layer of conductive material 53 is deposited on substrate 32, to serve as a shorting layer, according to methods known in the art. The conductive layer 53 may be titanium—tungsten (Ti—W) alloy, a chrome—gold (Cr—Au) bi-layer, or any other appropriate conductive precursor layer, typically deposited by sputtering to a thickness between about 300 and 10,000 Å. The shorting layer 53 substantially conforms to and contiguously covers the surface of the substrate 32, and any contact pads or other features that may be present on the substrate. Alternatively (but less preferably for the purposes of method 1300), shorting layer 53 can be deposited in a pattern of multiple, non-contiguous regions. Patterning the shorting layer 53 is generally for the purpose of defining a redistribution layer between contact pads on the substrate 32 and the spring structures to be formed.

At step 1304, the sacrificial material layer 30 is deposited according to a method previously described. At step 1306, a molding surface 48 with an overhanging lip 96 is formed in the layer of sacrificial material, preferably using a re-entrant tooth or progressive stamping tool, as previously described. At step 1308, a seed layer 52 and 55 is deposited on the surface of the sacrificial layer, using a process such as sputtering (especially ionized physical-vapor deposition (I-PVD)), or similar line-of-sight deposition process. It will be apparent that the overhanging lip 96 shields the perimeter of the molding surface from deposition of the seed layer, resulting in a first portion 52 of the seed layer disposed over the molding surface 48 and base area in recess 86, and a second portion 55 of the seed layer over the surrounding area of the sacrificial material layer, as shown in FIG. 14A. If will further be apparent that, so long as the overhanging lip 96 fully encloses the recess 86, the first portion 52 of the seed layer will be connected to the shorting layer 53, and the second portion 55 will be isolated from the shorting layer 53 and from the first portion 52.

Then, in step 1310, the substrate is electroplated with a resilient material using shorting layer 53 to apply a plating potential to the first portion 52. The resilient material 58 thus is selectively plated on the first portion 52 of the seed layer, and does not cover the second portion 55. Then, at step 1312, the sacrificial material layer and second portion 55 of the seed layer are removed by dissolving the sacrificial material in a suitable solvent, as previously described. It should be noted, however, that even if the resilient material 58 is incidentally plated over the second portion 55, this unwanted plated material can later readily be removed without harming the desired spring structures, so long as it is not continuous with the resilient material 58 plated over the first portion 52. In either case, a separate, free-standing spring structure results from application of the method 1300, an exemplary one of which is shown in FIG. 14D, without the need for any separate patterning step.

Figure 15:
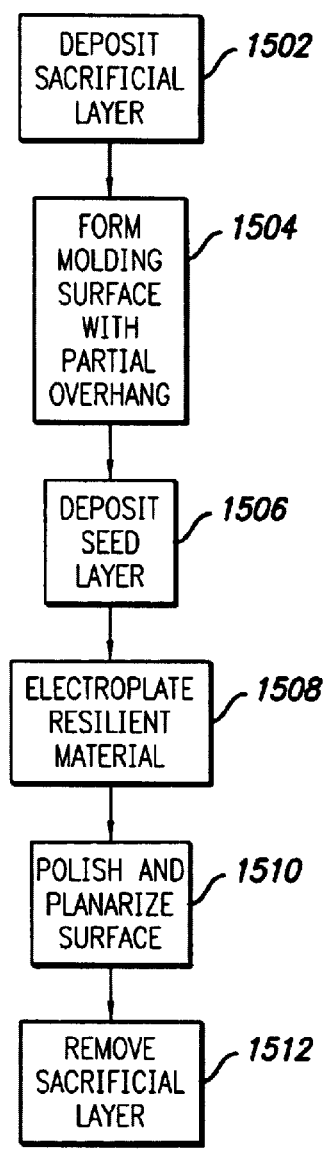
FIG. 15 is a flow diagram showing exemplary steps for forming a spring structure according to an embodiment of the invention that avoids a masking step by using a partially encircling overhanging lip.
Figure 16A:
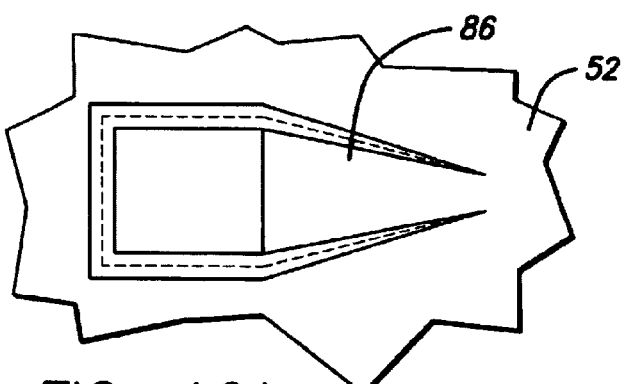
FIG. 16A is a plan view of an exemplary mold cavity with materials layered thereon during an exemplary one of the steps shown in FIG. 15.
Figure 16B:
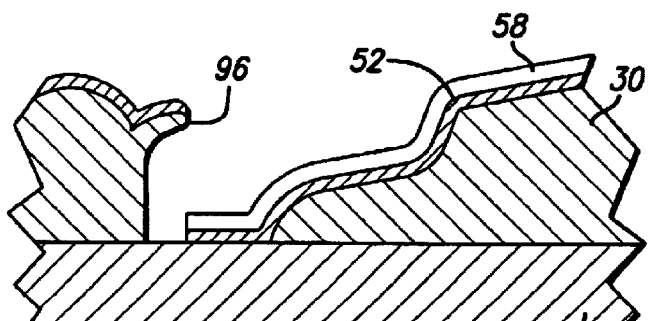
FIGS. 16B–16D are cross-sectional views of a substrate and materials layered thereon during the exemplary ones of the steps shown in FIG. 15.
Figure 16C:
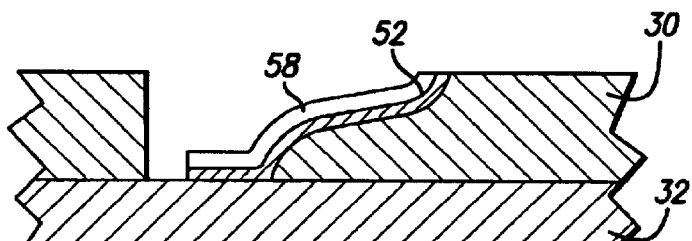
Figure 16D:
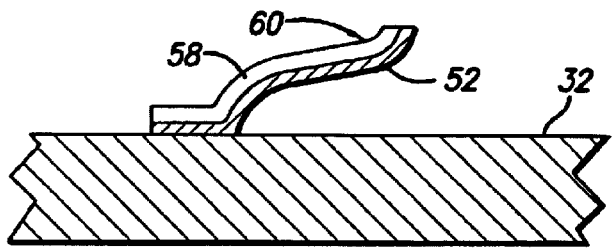

A similar process may be used, utilizing a partially enclosing overhanging lip, according to the method 1500 shown in FIG. 15. No shorting layer is needed for method 1500, however, an additional step is needed to separate the resilient material of the spring structures from the surrounding material. A plan view of the substrate during a step of the method is shown in FIG. 16A, and cross-sectional views of the substrate and materials layered thereon during steps of the method are shown in FIGS. 16B–16D. In step 1502, a layer of sacrificial material is deposited according to one of the previously described methods. In step 1504, a molding surface is formed as described above, except that the overhanging lip 96 does not completely enclose the molding surfaces within recess 86. As shown in FIG. 16A, the overhanging lip 96 is formed to enclose the recess 86 on three sides, and no lip is formed on the side adjacent to the top of the sacrificial layer, where the tip of the spring structure will be formed. In step 1506, a seed layer 52 is deposited over the surface of the sacrificial layer 30, using a line-of-sight method, as previously described. Because recess 86 is not completely enclosed by the overhanging lip, the seed layer 52 is electrically connected to the deposited seed layer everywhere else on the surface of layer 30, as shown in FIG. 16A. Seed layer 52 can thus be used for electroplating the resilient material 58, and no shorting layer is needed for this purpose (although one may optionally be present, for other reasons).

The appearance of the substrate after deposition of the resilient material layer is shown in FIG. 16B. As is also clear from FIG. 16A, the layer of resilient material 58 will be parted on all sides of the recess 86, where no seed layer was deposited, except for near the surface of layer 30, where it is connected to a more generally extending layer. It is necessary, therefore, to remove the excess resilient material, which is done is step 1510, by any suitable precision machining method, such as chemical/mechanical polishing. At the same time, the surface of layer 30 is preferably planarized, so the tips of the spring structures will reside in the same plane, for the reasons discussed previously. A cross-section of the substrate after step 1510 is shown in FIG. 16C. The next step is to remove the remaining portion of sacrificial layer 30, using any of the methods described herein, to leave the free standing spring structure 60, as shown in FIG. 16D.

In some cases it may be advantageous to form a plurality of microelectronic spring contacts by replicating a single mold tooth (or a relatively small group of teeth), instead of by using a stamping or molding tool having a plurality of teeth covering a relatively large area, such as the area of an die or wafer. The present invention provides a "one-up" method 1700, exemplary steps of which are shown in FIG. 17, for such cases. For example, method 1700 may be advantageous for small production runs, or runs involving atypical "custom" positioning of the spring structure, because it avoids the need for an intricate stamping tool having many teeth. FIGS. 18A–18E show cross-sectional views of a substrate 32 and layered materials during steps of the method 1700. FIG. 18F shows a perspective view of exemplary molding surfaces 48 which may be formed using method 1700, for molding spring structures, or for use as a stamping tool with many teeth. In an initial step 1702, a layer of sacrificial material 30 is deposited on substrate 32. In an embodiment of the invention, the layer 30 is a material that may be cured (hardened) by exposure to a radiation, such as by exposure to UV light, or to an electron beam. FIG. 18A shows the sacrificial layer after deposition during step 1702. Also shown is an exemplary single-tooth stamping tool 34, having a tooth 36. Tooth 36 is as previously described; however, in an embodiment of the invention, tooth 36 is additionally provided with a radiation-transparent portion 39 and an opaque portion 41.

A process loop, comprising steps 1704 through 1708, is then performed. In a first cycle of the loop, a single contoured molding surface is formed using tooth 36, at step 1704. FIG. 18B shows the substrate 32, layer 30, and tooth 36 during step 1704, with tooth 36 fully impressed into substrate 30. Flash 49 is evident on either side of tooth 36. In step 1706, while tooth 36 is in position, molding surface 48, which is under transparent portion 39 of tooth 36, is preferably selectively cured. In an embodiment of the invention, UV light is beamed through the tooth 36 to cure portion 31. The opaque portion 41 preferably prevents the sacrificial layer 30 from being cured in the area of the base, so that the substrate may be more readily exposed to a layer of resilient material there. Steps 1704 and 1706 are repeated until the desired number of molding surfaces 48 have been defined, as indicated by decision step 1708. The appearance of the substrate during a second cycle of the process loop is shown in FIG. 18C, and the appearance of the substrate after the second cycle is shown in FIG. 18D. Two cured portions 31 are shown, surrounded by uncured areas of flash 49. These uncured portions are readily removed in step 1710, by dissolving in a suitable solvent, leaving only the molding surfaces 48 comprised of cured portions 31. The molding surfaces may be used for forming spring structures as previously described. In the alternative, the molding surfaces 48 may be used as the teeth of a stamping tool. It should be apparent that stamping methods using a transparent tooth, such as method 1700, are readily adaptable to methods using tools with a plurality of transparent teeth separated by opaque regions, which may be used, for example, to form a plurality of spring structures in parallel at single-die, multiple-die and wafer scales.

A similar "one-up" method may be used to form molding surfaces for spring contacts, using plunge electrical discharge machining ("EDM"). According to a plunge EDM method, a suitable plunge EDM tool is shaped like, and replaces, the transparent stamping tooth 36 discussed above with respect to method 1700. Instead of embossing a deformable substrate, the plunge EDM tool is used to form molding surfaces in a substantially non-deformable, electrically conductive substrate. Candidates for molding surfaces include metals and polymers filled with conductive particles or fibers. The surface so formed may be used as a mold form for spring contacts, or as a multi-toothed forming tool, depending on the characteristics of the conductive substrate and the desired objective.

In yet another embodiment of the invention, a spring structure is formed on a molded substrate utilizing the properties of a line-of-sight material deposition technique, such as sputtering or evaporation, so as to eliminate certain process steps. Exemplary steps of a method 1900 using a line-of-sight deposition technique are shown in FIG. 19. Exemplary views of a substrate and layered materials during method 1900 are shown in FIGS. 20A–20E. At step 1902, a substrate 32 is provided, typically having at least one exposed contact pad 46. At step 1904, dielectric layer 43 is optionally deposited and patterned as known in the art. At optional step 1906, a shorting or adhesion layer 53, such as a layer of titanium, titanium-tungsten, or chromium, is deposited over layer 43 and contact pad 46 as known in the art. The purpose of layer 53 is to facilitate the subsequent optional plating step 1916. If step 1916 is to be omitted, step 1906 is preferably omitted also. At step 1908, a sacrificial layer of moldable material 30 is deposited on substrate 32, and formed, such as by embossing with a stamping tool, to provide a mold for a microelectronic spring. Any suitable moldable material, such as described herein, may be used. At step 1910, any residual moldable material 30 covering contact pad 46 is removed, such as by using a suitable anisotropic etch process. A layer of metallic material 52 is then deposited over the moldable layer 32 using a line-of-sight process, such as sputtering or evaporation, at step 1912.

Exemplary views of a substrate and layered materials after completion of step 1912 are shown in FIGS. 20A and 20B. A recess 86 having vertical or relatively steep sidewalls 87 has been provided in layer 30, such as by a stamping tool having a suitably shaped embossing tooth. For the purposes of method 1900, "steep" means inclined (positively or negatively) less than about 45° from vertical, and preferably, less than about 30° from vertical. Still more preferably, sidewalls 87 are inclined between about 0°–5° from vertical. A bottom surface of recess 86 comprises a molding surface 48 for defining the shape of a microelectronic spring structure. Molding surface 48 is isolated from the top surface 57 of the moldable layer 30 by the sidewalls 87 which preferably surround the entire periphery of recess 86, thereby separating molding surface 48 from the upper surface 57 of layer 30. As shown in FIG. 20C, because of the properties of line-of-sight deposition, the thickness "$t_1$" of the layer 52 is substantially greater on the molding surface 48 of layer 30 than the thickness "$t_2$" on the sidewalls 87. In particular, if sidewalls 87 are substantially vertical, or overhang the molding surface 48 (that is, are inclined with respect to the line of deposition of the line-of-sight deposition method so as to not present a face for deposition of material thereon), no material will be deposited on the sidewalls. Although the upper surface 57 of layer 30 is shown as being substantially horizontal and planar, the shape and inclination of surface 57 is not critical, and may have a variety of different shapes, so long as sidewalls 87 are present and inclined so as to isolate surface 57 from molding surface 48.

At step 1914, if present on sidewalls 87, layer 52 is etched isotropically to remove all of layer 52 adhering to sidewalls 87 while leaving it substantially intact on molding surface 48 and top surface 57. That is, the etching step 1914 preferably is halted as soon as sidewalls 87 are free of deposited metallic material, at which point layer 52 on molding surface 48 will preferably be of a desired thickness. After step 1914, layer 52 on molding surface 48 will remain electrically connected to shorting layer 53. An isolated portion 55 of layer 52, on the upper surface 57 of layer 30, will be physically isolated from layer 52 on molding surface 48, and preferably, also electrically isolated from shorting layer 53. Layer 52 is thus patterned to define a spring structure, by separation of the molding surface 48 from upper surface 57 by sidewalls 87, and elimination of metallic (or resilient) material from the sidewalls. It should be apparent that if there is no metallic layer 52 on sidewalls 87 after deposition step 1912 (such as if sidewalls 87 are vertical or overhanging) step 1914 will be unnecessary and may be omitted.

At optional step 1916, a layer of resilient material 58 is electroplated onto the portion of layer 52 on molding surface 48. Preferably, no additional material will be plated onto the isolated portion 55, because it is preferably not connected to shorting layer 53, through which the plating current flows. A view of the substrate and layered materials after completion of step 1916 is shown in FIG. 20D. Note that resilient layer 58 does not contact the isolated portion 55. Hence, isolated portion 55 and sacrificial moldable layer 30 are readily removed at step 1918, such as by dissolution in an etchant, without damaging the resilient material 58 deposited on molding surface 48. It should further be apparent that if metallic layer 52 is sufficiently thick to provide the desired strength and stiffness, plating step 1916 may be omitted. In particular, where the spring structure is to be provided with stiffening features, such as a contoured or ribbed cantilevered portion, plated layer 58 (which may be used to provide strength and stiffness) is less likely to be necessary. FIG. 20E shows a cross-sectional view of the resulting spring structure 60 after removal of the sacrificial moldable layer 30 at step 1918. Isolated portion 55 and exposed portions of shorting layer 53 are also removed at step 1918. A plurality of microelectronic spring structures, such as structure 60, may thus be formed in parallel using method 1900, without the need for any pattern-masking step.

Other structures may be formed on the surface of a substrate at the same time as, and using the same processes as used for forming a microelectronic spring. In particular, redistribution traces, bridges, and bumps may be formed with a spring structure according to the present invention. FIGS. 21A–21D show a substrate and layered materials during exemplary steps of a method for forming a redistribution trace 45 and bridges 59 with a spring structure 60. Although method 1900 is adapted for this purpose to illustrate an application thereof that omits the plating steps, any other suitable method described herein may also be used to form features in parallel with a spring structure. FIG. 21A shows a substrate having a contact pad, dielectric layer, and moldable layer 30, as described above in connection with method 1900. After preparation of moldable layer 30, a stamping tool 34 is used to define a molding surface 48, a trace-defining portion 63 for molding for a redistribution trace, and bumps 61.

FIG. 21B shows the substrate with stamping tool 34 fully impressed into moldable layer 30. Bumps 61 may be any suitable shape, and have a height less than the tip height of the spring structure to be formed. In an embodiment of the invention, bumps 61 have a height and shape suitable for acting as stop structures, i.e., structures capable of preventing over-compression, for their companion spring structure. For example, suitable shapes include those with arched, semi-circular, triangular, or rectangular cross sections, having a height above the substrate sufficient to prevent over-compression of the spring structure. Bumps 61 may be configured as connected to trace-defining portion 63, or as isolated from it.

Residue 51 is typically present on the substrate 32 after the tool 34 is removed. Such residue is removed to reveal the contact pad 46 and dielectric layer 43 at the bottom of recess 86 in the area of the redistribution race and base for the spring structure. By suitable design of tool 34, recess 86 is surrounded by steep sidewalls 87 which separate molding surface 48 and the bottom of recess 86 from the upper surface 57 of moldable layer 30, as previously described herein. A layer of resilient material is deposited generally on the substrate, including over the bottom of recess 86 and over molding surface 48, using a line-of-sight deposition technique. FIG. 21C shows the molded resilient material 52 after deposition of resilient layer 58. In this example, layer 58 is sufficiently thick so that no additional resilient layer is needed.

Moldable layer 30 is then removed, revealing a spring structure 60 with an integral redistribution trace, as shown in FIG. 21D. In this example, spring structure 60 has a contoured beam for enhanced stiffness. Bridges 59 correspond to bumps 61 formed by tool 34. Bridges 59 may serve to provide stress relief to trace 45, particularly if trace 45 is relatively lengthy. Bridges 59 may also serve as stop structures for spring structure 60. Additional bridges (not shown) may additionally be provided, that are electrically isolated from any contact element, and therefore perform a purely mechanical function, such as a mechanical stop. Thus, a complete contact system, including a plurality of spring contacts, associated redistribution traces, and stop structures, can be made using relatively few process steps. To further illustrate an application of the method, FIG. 22 shows an exemplary two of many contact structures with integral redistribution traces, for performing a pitch spreading function from a relatively fine pitch "p1" at the contact pads, to a coarser pitch "p2" at the tips of the spring elements. A wide variety of geometric configurations for pitch spreading and other redistribution purposes are possible, without departing from the scope of the invention.

Figure 23A:
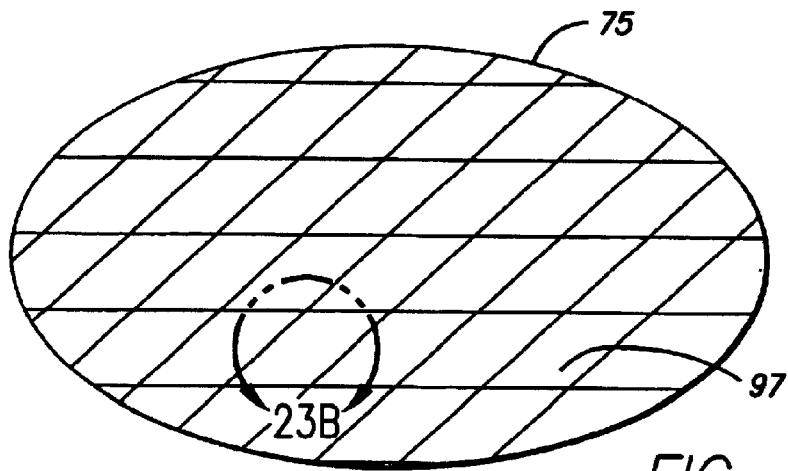
FIGS. 23A–23C are perspective views, taken at successively higher levels of magnifications of an exemplary spring structure and stop structure formed by a method according to the invention, wherein the substrate comprises a wafer.
Figure 23B:
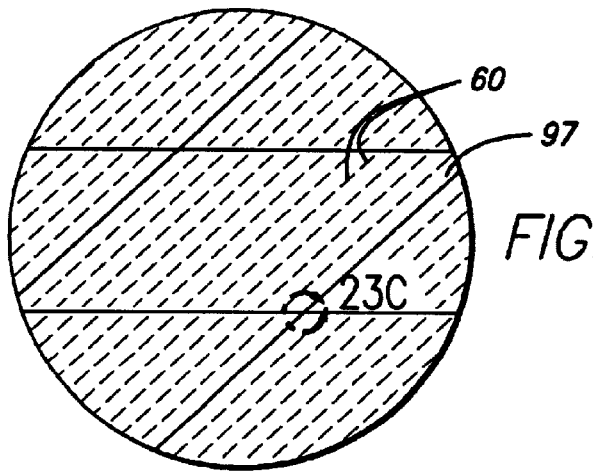
Figure 23C:
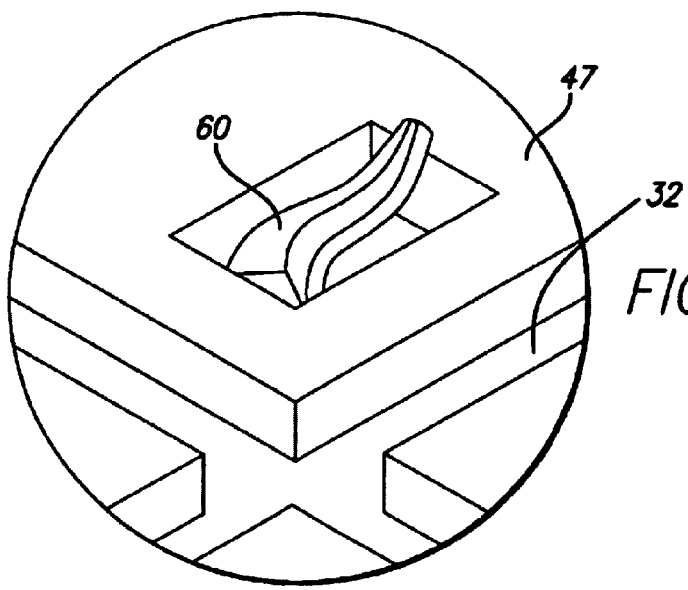

In an alternative embodiment, a separately formed stop structure, as further described in the co-pending application Ser. No. 09/364,855, filed Jul. 30, 1999, entitled "INTERCONNECT ASSEMBLIES AND METHODS," by Eldridge and Mathieu, which is hereby incorporated herein by reference, is provided to prevent over-compression of the microelectronic spring structures under application of a contact force, according to methods described therein. Perspective views of a substrate 32 with an array of contoured, microelectronic spring contacts 60, and provided with stop structures 47, are shown in FIGS. 23A–23C. The substrate is shown at a wafer level in FIG. 23C. A view of a single die 97 on the wafer, showing an array of spring structures 60 on the die, is shown in FIG. 23B. A detailed view of a single contoured spring structure 60 and surrounding stop structure 47 is shown in FIG. 23C. It should be apparent that the spring structures may be disposed in any desired pattern on the substrate. In particular, spring structures may be disposed at locations on the substrate remote from underlying contact pads and vias, by creating an intermediate redistribution layer between the contact pads or vias and the spring structures, as further described in the co-pending application Ser. No. 09/364,855 referenced above.

It should be appreciated that the contoured microelectronic spring structures 60 described herein, such as shown in FIGS. 23A–23C may also be used for other types of interconnect assemblies, such as probe card assemblies, interposers, and other connection systems where electrical contact to or through a substrate is desired. In particular, such spring structures may be used both for making high-temperature, temporary connection during a wafer or chip level burn-in process, and subsequently, for making a more permanent, ambient temperature connection between the substrate and an electronic component such as a printed circuit board. It is anticipated that the low cost and versatility of the spring structures will greatly reduce the costs associated with high-temperature testing by permitting testing at higher temperatures, and thus achieving higher throughput than is possible using methods according to the prior art.

The methods of the present invention are further illustrated by the following example:

EXAMPLE

A silicon wafer with a 0.5 micron surface oxide layer was selected for a prototype substrate. A layer of chrome was sputtered on a surface of the substrate, followed by a layer of gold, to provide a shorting layer. A 4.0 mil (100 micron) thick layer of negative dry-film photoresist was applied to the sputtered gold layer using a vacuum laminator. A second 3.0 mil (75 micron) thick layer of the same type of photoresist was applied over the first layer. The substrate was placed on a hot plate and heated until the photoresist was soft. An embossing tool with protruding triangular teeth contoured to produce the desired spring shape was pressed into the photoresist laminate while the laminate was soft. The substrate was cooled and the embossing tool was removed. A photolithography mask and UV light were used to expose (and thus cross link) the photoresist laminate everywhere except in the area of the spring base contact. The photoresist was developed using a spray developer with standard sodium carbonate developer solution, which removed the unexposed photoresist from the spring-base contact. The spring-base contacts were then cleaned using an oxygen plasma descum for ten minutes. A seed layer of metal (palladium/gold) for a subsequent electroplating step was sputtered over the entire surface of the photoresist laminate and exposed base area. A 4.0 mil layer of dry-film photoresist was applied over the sputtered layer using a vacuum laminator at 80° C. The photoresist was exposed with UV light using a photolithography mask to shield the resist over the molding surface, where the spring was to be formed. The photoresist was then developed to remove in the area of the molding surface, and then a plasma descum was used to clean the molding surface as before. A resilient spring metal (nickel) was deposited in the mold form by electroplating for 20 minutes at about 50 ASF current density. The substrate was removed from the electroplating solution and immersed in a solution of RD87 negative resist stripper to remove all layers of photoresist. A free-standing spring structure remained on the substrate having a thickness of 12 microns (about 0.5 mil), a cantilevered beam that was triangular in plan view and that extended about 180 microns (7 mils) from the surface of the substrate.

Having thus described a preferred embodiment of a method for forming microelectronic spring structures, it should be apparent to those skilled in the art that certain advantages of the invention have been achieved. It should also be appreciated that various modifications, adaptations, and alternative embodiments thereof may be made within the scope and spirit of the present invention. For example, a method for forming microelectronic spring contact structures has been illustrated, but it should be apparent that the inventive concepts described above would be equally applicable to form similar structures for other purposes. For example, electro-mechanical spring contacts, such as relays, or purely mechanical springs could be formed on a variety of substrates for various applications using the methods described herein. Additionally, other lithographic type structures comprising open contoured sheets of materials, such as channels, funnels and blades, may be made at microscopic scales by suitably adapting the methods herein. The invention is further defined by the following claims.

What is claimed is:

1. A method of forming a plurality of electrically conductive contact structures on an electronic component comprising a plurality of electrically conductive contact elements, each said contact structure comprising a base connected to one of said contact elements and a beam, said method comprising:

depositing a layer of moldable material on said electronic component;

providing a stamping tool comprising a plurality of protruding regions, a plurality of contoured regions, and a plurality of recessed regions, each said protruding region defining a base of one of said contact structures and corresponding to one of said contact elements on said electronic component, each said contoured region defining a beam of one of said contact structures, and each said recessed region defining a separation between adjacent ones of said contact structures;

aligning said protruding regions of said stamping tool with said contact elements of said electronic component;

pressing said stamping tool into said moldable material, said plurality of protruding regions forming molds in said moldable material of bases of said contact structures, and said plurality of contoured regions forming beam molds in said moldable material of beams of said contact structures; and depositing contact structure material into said beam molds and said base molds.

2. The method of claim 1, wherein said step of depositing a layer of moldable material on an electronic component comprises:

placing said electronic component in a mold; and injecting said moldable material into said mold.

3. The method of claim 1 further comprising planarizing said layer of moldable material deposited on said electronic component.

4. The method of claim 1 further comprising heating said stamping tool during said step of pressing said stamping tool into said moldable material.

5. The method of claim 4 further comprising, after heating said stamping tool, cooling said stamping tool while said stamping tool is pressed into said moldable material.

6. The method of claim 1 further comprising cooling said stamping tool while said stamping tool is pressed into said moldable material.

7. The method of claim 1, wherein at least one of said contoured regions comprises a ribbed surface.

8. The method of claim 1, wherein at least one of said contoured regions comprises a corrugated surface.

9. The method of claim 1, wherein at least one of said contoured regions is selected from a group consisting of a V shape, a U shape, or a bifurcation.

10. The method of claim 1 further comprising:
   after pressing said stamping tool into said moldable material, removing said stamping tool and depositing a seed layer of conductive material over said moldable material; and
   patterning a layer of masking material over said seed layer, wherein patterns in said masking material correspond to pairs of said beam and base molds, and
   wherein said contact material is deposited into said molds by depositing said contact material onto said seed layer through said patterns in said masking material.

11. The method of claim 10 further comprising removing said masking material and said moldable material.

12. The method of claim 1, wherein said stamping tool further comprises a plurality of reentrant teeth disposed to form a plurality of lips in said moldable material.

13. The method of claim 12, wherein said moldable material is elastic.

14. The method of claim 1, wherein said step of depositing contact structure material comprises depositing said contact structure material using an electroless deposition process.

15. The method of claim 1, wherein said electronic component comprises a plurality of dies composing an unsingulated semiconductor wafer.

16. The method of claim 15, wherein said contact elements are terminals of said dies.

17. The method of claim 1, wherein said moldable material is selected from a group consisting of polymethylmethacrylates, polycarbonates, polyurethanes, ABS plastics, photoresists, novolac resins, epoxies, and waxes.

18. The method of claim 1, wherein said moldable material is selected from a group consisting of polymethylmethacrylates, photopolymers, novolac resins, and epoxies.

19. The method of claim 1, wherein said moldable material comprises a thermoplastic material.

* * * * *